(12) United States Patent
Morizono et al.

(10) Patent No.: US 7,710,628 B2
(45) Date of Patent: May 4, 2010

(54) METHOD AND APPARATUS FOR CORRECTING OUTPUT LIGHT-AMOUNTS OF SPATIAL LIGHT MODULATOR, IMAGE RECORDING APPARATUS, AND IMAGE RECORDING METHOD

(75) Inventors: Osamu Morizono, Kyoto (JP); Yoshimi Hashimoto, Kyoto (JP)

(73) Assignee: Dainippon Screen Mfg. Co., Ltd., Kyoto (JP)

( * ) Notice: Subject to any disclaimer, the term of this patent is extended or adjusted under 35 U.S.C. 154(b) by 403 days.

(21) Appl. No.: 11/898,069

(22) Filed: Sep. 7, 2007

(65) Prior Publication Data
US 2009/0116092 A1    May 7, 2009

(30) Foreign Application Priority Data

Sep. 7, 2006  (JP) ............... P2006-242334
Mar. 30, 2007 (JP) ............... P2007-90831

(51) Int. Cl.
G02B 26/00  (2006.01)
G02B 26/02  (2006.01)
G02B 5/18   (2006.01)
B41J 2/385  (2006.01)
B41J 2/47   (2006.01)

(52) U.S. Cl. .............. 359/239; 359/291; 359/231; 359/572; 347/135; 347/239; 347/255

(58) Field of Classification Search ............... 359/231, 359/237, 239, 290, 291, 558, 563, 566, 572, 359/573; 347/135, 239, 255
See application file for complete search history.

(56) References Cited

U.S. PATENT DOCUMENTS 6,025,859 A    2/2000  Ide et al.

2004/0248021 A1  12/2004  Nolan
2007/0097387 A1   5/2007  Tamaki

FOREIGN PATENT DOCUMENTS

| EP | 1 311 108 A2 | 5/2003 |
| JP | 2002-503351 | 1/2002 |
| JP | 2007-121881 | 5/2007 |
| WO | WO 93/22694 | 11/1993 |

OTHER PUBLICATIONS

European Search Report, issued in European Patent Application No. 07115879.4-2217, dated on Dec. 21, 2007.
Corrigan et al. "17.3 Calibration of Scanned Linear Grating Light Valve Projection System", SID International Symposium, May 18, 1998.
Amm et al. "5.2 Grating Light Valve Technology: Update and Novel Applications", SID International Symposium, May 17, 1998.

*Primary Examiner*—Jack Dinh
(74) *Attorney, Agent, or Firm*—McDermott Will & Emery LLP

(57) ABSTRACT

In each light modulator element of a special light modulator with diffraction grating structure where moving ribbons and fixed ribbons are alternately arranged, the maximum light-amount ($I1$) when an output light-amount first becomes maximum from when the moving ribbons start to sag and the maximum light amount-voltage becoming an displacement amount ($P1$) at the maximum light-amount, are obtained and the minimum of a plurality of maximum light-amounts is set as a target ON light-amount ($It$). Since a voltage (corresponding to a displacement amount ($Pt1$)) between the maximum light amount-voltage and the minimum light amount-voltage at a displacement amount ($P2$) is obtained as a target ON-voltage for the target ON light-amount ($It$), it is thereby possible to prevent moving distance of the moving ribbons among ON/OFF from largely differing among the light modulator elements and achieve an appropriate image recording.

20 Claims, 18 Drawing Sheets

METHOD AND APPARATUS FOR CORRECTING OUTPUT LIGHT-AMOUNTS OF SPATIAL LIGHT MODULATOR, IMAGE RECORDING APPARATUS, AND IMAGE RECORDING METHOD

BACKGROUND OF THE INVENTION

1. Field of the Invention

The present invention relates to a technique for correcting output light-amounts of a spatial light modulator with diffraction grating structure and the special light modulator is preferably used for recording an image.

2. Description of the Background Art

Developed has been a light modulator element of diffraction grating type which is capable of changing the depth of grating. The light modulator element is produced using a semiconductor device manufacturing technique and is alternately provided with fixed ribbons and moving ribbons on a substrate. The moving ribbons can be sagged relatively to the fixed ribbons to change the depth of grating. It is proposed that such a light modulator element is used for an image recording apparatus in techniques such as CTP (Computer to Plate) as an optical switching element, since the intensities of specular reflection light and diffracted light beams are controlled by changing the depth of grooves on the diffraction grating as above. Published Japanese translation of PCT. No. 2002-503351 discloses a light modulator element where fixed ribbons are formed on a substrate and moving ribbons are formed at positions away from the substrate.

The light modulator element of diffraction grating type has characteristics that an outputted light amount can be continuously changed. In a spatial light modulator having an array of such light modulator elements, an output light-amount diffracted from each light modulator element in an ON state and an OFF state can be equalized even if light from a light source has slight unevenness or physical properties are slightly different between the light modulator elements.

In the mean time, since a zeroth order light beam (specular reflection light) is outputted when an input voltage is 0 and a light amount of the zeroth order light beam is maximum in a case of a light modulator element of diffraction grating type where the height of the moving ribbons is the same as that of the fixed ribbons when the moving ribbons are not sagged, unevenness in the output light-amounts between the light modulator elements can be corrected with reference to the state of the light modulator element at an input voltage of 0. On the other hand, in a case of a light modulator element of diffraction grating type where the height of the moving ribbons is different from that of the fixed ribbons when the moving ribbons are not sagged, since the zeroth order light beam first becomes maximum after inputting a certain amount of voltage, a plurality of input voltages for acquiring a desired light amount may exist in the vicinity of a voltage where the light amount of the zeroth order light beam is maximum and therefore, it is not possible to easily determine an appropriate input voltage.

SUMMARY OF THE INVENTION

The present invention is intended for a method of correcting output light-amounts of a spatial light modulator with diffraction grating structure comprising a plurality of light modulator elements. In the spatial light modulator, each light modulator element of the plurality of light modulator elements comprises fixed reflective portions having strip-like fixed reflective surfaces parallel to a base surface and moving ribbons having strip-like moving reflective surfaces parallel to the base surface, and the fixed reflective portions and the moving ribbons are alternately arranged in a predetermined direction in each light modulator element. The moving ribbons are sagged in accordance with a voltage inputted to each light modulator element, to change a height of the moving reflective surfaces from the base surface, each light modulator element changes between a state of emitting a zeroth order light beam and a state of first order diffracted light beams, and a height of the moving reflective surfaces from the base surface is different from that of the fixed reflective surfaces from the base surface in a state where the moving ribbons are not sagged in each light modulator element.

The method of correcting output light-amounts of a spatial light modulator in accordance with the present invention comprises the steps of: a) setting a light amount of an output light, which is a zeroth order light beam or first order diffracted light beams outputted from each light modulator element in an ON state or an OFF state, as a target light-amount which is common to the plurality of light modulator elements; and b) obtaining a target voltage which is equal to an input voltage to each light modulator element when an output light-amount of each light modulator element first reaches the target light-amount in gradually increasing or decreasing the input voltage from a voltage corresponding to a light amount which is closer to the target light-amount out of the first minimum light-amount when a light amount of an output light first becomes minimum from when the moving ribbons start to sag in increasing the input voltage and the first maximum light-amount when a light amount of an output light first becomes maximum from when the moving ribbons start to sag in increasing the input voltage.

According to the present invention, it is possible to obtain an appropriate target voltage to be inputted to the spatial light modulator comprising the light modulator elements in each of which a height of the moving reflective surfaces is different from that of the fixed reflective surfaces in a state where the moving ribbons are not sagged.

According to a preferred embodiment of the present invention, the step a) comprises the steps of: a1) obtaining the first maximum light-amount of each light modulator element and a maximum light amount-voltage which is inputted to each light modulator element at the first maximum light-amount; and a2) setting the target light-amount which is a light amount being equal to or smaller than a minimum out of a plurality of first maximum light-amounts of the plurality of light modulator elements and being equal to or larger than a predetermined light amount.

More preferably, the step a) further comprises, before the step a1), the steps of: a3) dividing the plurality of light modulator elements into at least one group to input a plurality of voltages to light modulator elements in each group, respectively, the plurality of voltages gradually increasing in a voltage range which surely includes maximum light amount-voltages of the light modulator elements belonging to each group; a4) measuring a plurality of output light-amounts of the light modulator elements in each group; and a5) determining a voltage corresponding to a maximum out of the plurality of output light-amounts as a provisional voltage of the light modulator elements in each group, wherein the maximum light amount-voltage of each light modulator element belonging to each group is obtained by repeating measurement of an output light-amount while gradually increasing or decreasing an input voltage from the provisional voltage of each group in the step a1). It is thereby possible to rapidly obtain the maximum light amount-voltage.

A target light-amount and a target voltage in the OFF state is also obtained in a manner like the operation of obtaining the target light-amount and the target voltage in the above ON state in the step a).

According to another preferred embodiment of the present invention, the target light-amount is a light amount in an ON state, and the step a) comprises the steps of: a1) dividing the plurality of light modulator elements into at least one group to input a plurality of voltages to light modulator elements in each group, respectively, the plurality of voltages gradually increasing in a voltage range which surely includes voltages to be inputted at first maximum light-amounts of the light modulator elements belonging to each group; a2) measuring a plurality of output light-amounts of the light modulator elements in each group; a3) determining a voltage corresponding to a maximum out of the plurality of output light-amounts as a provisional voltage of the light modulator elements in each group; a4) inputting the provisional voltage to the light modulator elements in each group; and a5) setting the target light-amount which is a light amount being equal to or smaller than a minimum out of output light-amounts of the plurality of light modulator elements and being equal to or larger than a predetermined light amount. It is thereby possible to rapidly set the target light-amount with using the provisional voltage.

The method of using the provisional voltage can be also applied to a case where the target light-amount is a light amount in the OFF state.

A so-called binary search may be used as a method of obtaining the target voltage when an output light-amount of each light modulator element becomes the target light-amount.

The present invention is also intended for an apparatus for correcting output light-amounts of a spatial light modulator, and further intended for an image recording method and apparatus for recording an image on a recording material irradiated with light from a spatial light modulator while moving the light relatively to the recording material.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
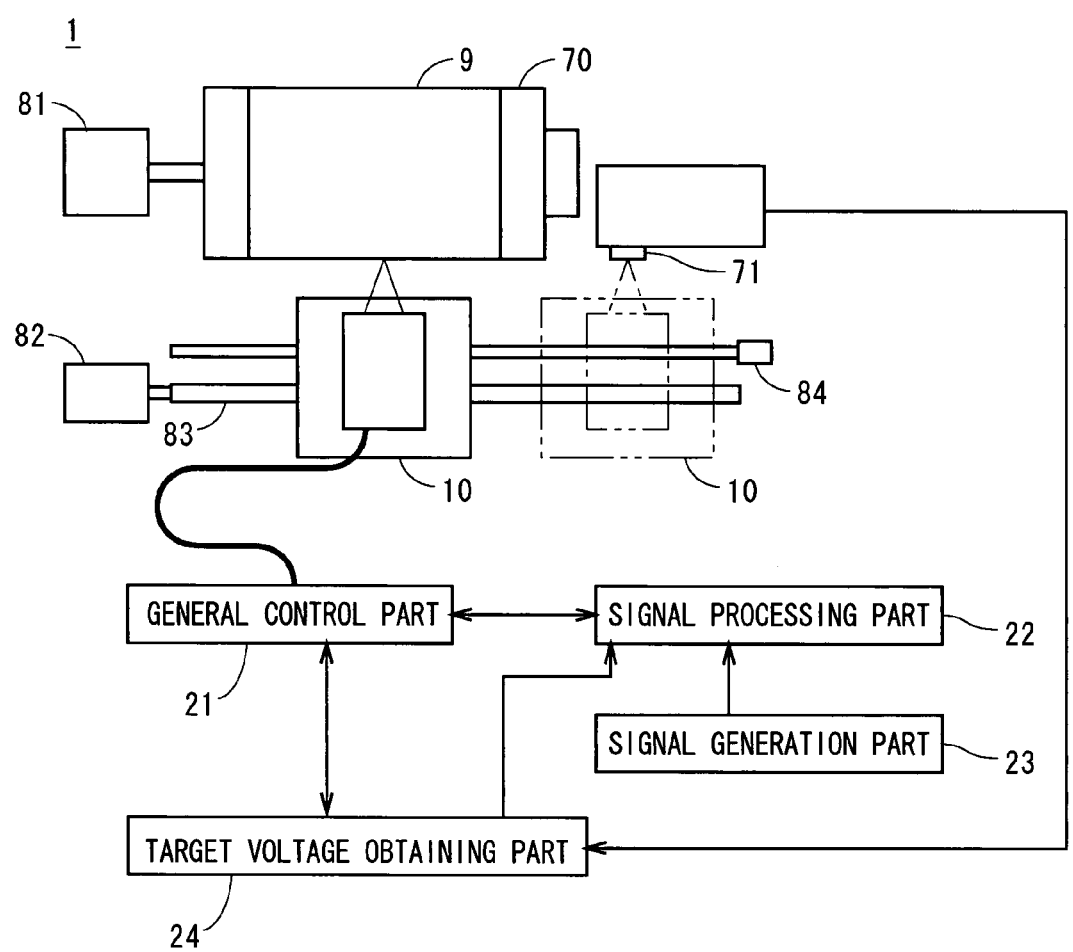
FIG. 1 is a view showing a constitution of an image recording apparatus in accordance with a first preferred embodiment.

FIG. 1 is a view showing a constitution of an image recording apparatus 1 in accordance with the first preferred embodiment of the present invention. The image recording apparatus 1 has an optical head 10 emitting light and a holding drum 70 which is a holding part for holding a recording material 9 on its outer surface. Light from a spatial light modulator of the optical head 10 is relatively moved while the light is applied onto the recording material 9 to record an image on the recording material 9 (i.e., an image is recorded by light irradiation). As the recording material 9, used are a printing plate, a film for forming the printing plate and the like, for example. A photosensitive drum for plateless printing may be used as the holding drum 70 and in this case, it is understood that the recording material 9 corresponds to a surface of the photosensitive drum and the holding drum 70 holds the recording material 9 as a unit.

The holding drum 70 is rotated about a central axis of its cylindrical surface by a motor 81 and the optical head 10 thereby travels relatively to the recording material 9 at a constant speed in a main scan direction (in a direction crossing an arrangement direction of positions irradiated with light from a plurality of light modulator elements later discussed). The optical head 10 is movable by a motor 82 and a ball screw 83 in parallel to a rotation axis of the holding drum 70 in a sub scan direction (orthogonal to the main scan direction), and the position of the optical head 10 is detected by an encoder 84. In other words, a scanning mechanism including the motors 81 and 82 and the ball screw 83 moves the outer surface of the holding drum 70 and the recording material 9 relatively to the optical head 10 having the spatial light modulator (and the light from the special light modulator) at a constant speed in the main scan direction and also, the scanning mechanism moves them relatively to the optical head 10 in the sub scan direction crossing the main scan direction. The motors 81 and 82, the encoder 84, and the optical head 10 are connected to a general control part 21, which controls the motors 81 and 82 and emission of light from the spatial light modulator in the optical head 10 to record an image on the recording material 9 held on the holding drum 70 by light.

A light amount measurement part 71 for measuring a light amount of an output light from each light modulator element of the spatial light modulator in the optical head 10 is provided at the side of the holding drum 70, and the optical head 10 can be transferred by the motor 82 and the ball screw 83 up to the position where the optical head 10 passes the light amount measurement part 71.

Data of an image to be recorded on the recording material 9 is prepared in a signal generation part 23 in advance, and a signal processing part 22 receives an image signal outputted from the signal generation part 23 on the basis of a control signal from the general control part 21. The signal processing part 22 converts the image signal into a signal for the optical head 10 to input the signal to the general control part 21, and then the general control part 21 inputs a voltage representing the image signal to each light modulator element of the spatial light modulator in the optical head 10. A target voltage obtaining part 24 for determining a desired light amount outputted from each light modulator element is further provided in the image recording apparatus 1, and the target voltage obtaining part 24 is connected to the light amount measurement part 71, the general control part 21, and the signal processing part 22.

Figure 2:
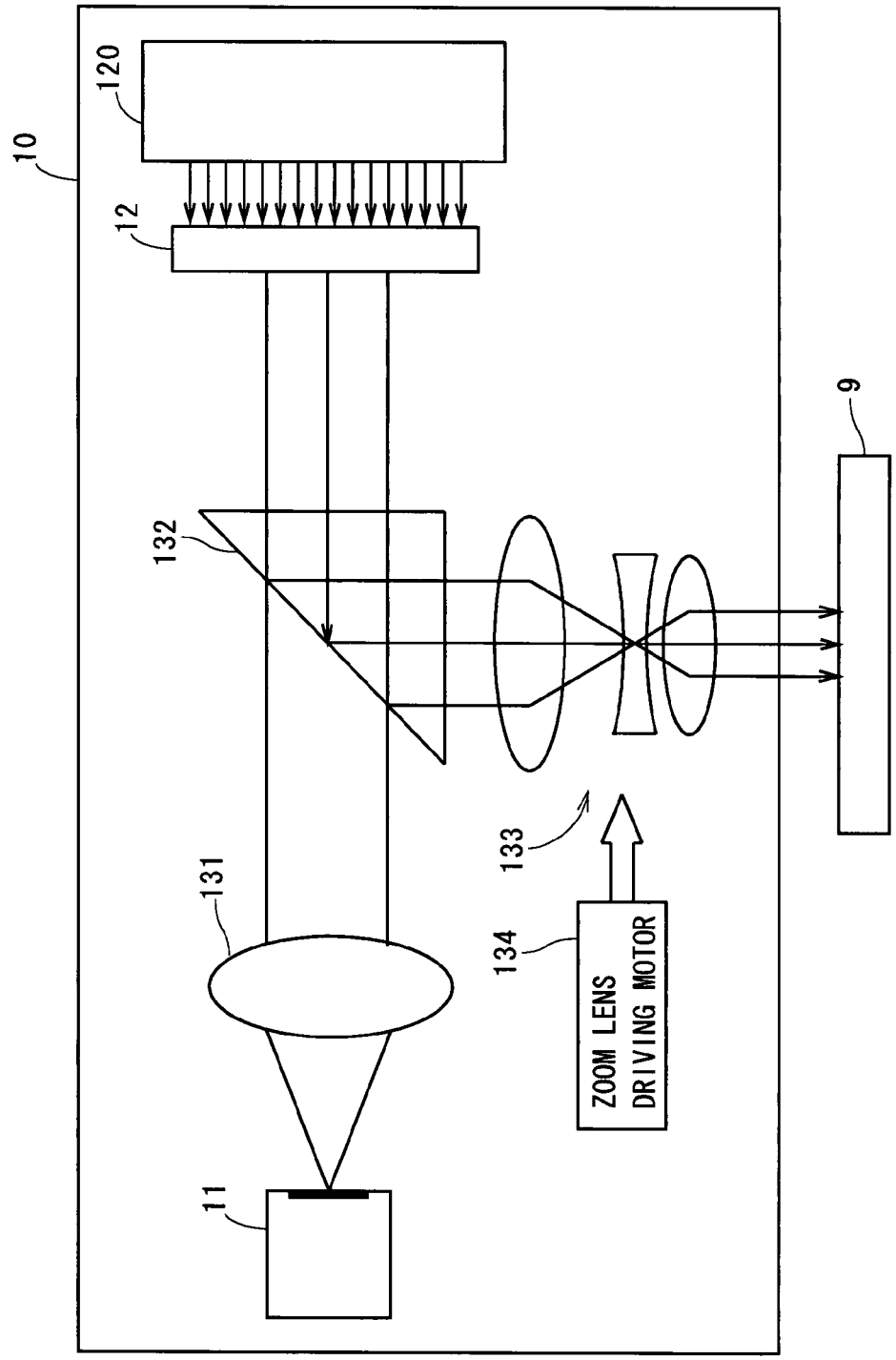
FIG. 2 is a schematic view showing an internal constitution of an optical head.

FIG. 2 is a schematic view showing an internal constitution of the optical head 10. In the optical head 10 disposed are a light source 11 which is a bar-type semiconductor laser having a plurality of light emitting points arranged in a line and a spatial light modulator 12 having a plurality of light modulator elements, which are aligned, of diffraction grating type. Light from the light source 11 is guided to the spatial light modulator 12 through an illumination lenses 131 (actually consisting of a condensing lens, a cylindrical lens, and the like) and a prism 132. In this case, the light from the light source 11 is linear beam light (light having a linear section of luminous flux), and applied onto the plurality of light modulator elements which are arranged linearly.

Each light modulator element of the spatial light modulator 12 is individually controlled on the basis of a signal from a device driving circuit 120 and each light modulator element can be changed between a state of emitting a zeroth order light beam and a state of emitting non-zeroth order diffracted light beams (mainly first order diffracted light beams ((+1)st order diffracted light beam and (−1)st order diffracted light beam)). The zeroth order light beam diffracted from the light modulator element is returned to the prism 132 and the first order diffracted light beams are directed to different directions from the prism 132. The first order diffracted light beams are blocked by a not-shown light blocking part so as not to be stray light.

The zeroth order light beam from each light modulator element is reflected by the prism 132 and directed to the recording material 9, which is located outside the optical head 10, through a zoom lens 133, and a plurality of spot images of the light modulator elements are formed on the recording material 9 so as to be arranged in the sub scan direction. In other words, the zeroth order light beam is the output light used for image recording, and the state of emitting the zeroth order light beam is an ON state and that of emitting the first order diffracted light beams is an OFF state in the light modulator elements 121. The magnification of the zoom lens 133 is changeable by a zoom lens driving motor 134 and the resolution of the image to be recorded is thereby changed.

In the above description, an optical axis of a luminous flux of the light which is directed from the illumination lens 131 to the spatial light modulator 12 coincides with that of a part of luminous flux of the zeroth order light beam which is reflected by the spatial light modulator 12 and directed to the zoom lens 133. However, since the prism 132 is arranged within the luminous flux of the light which is directed from the illumination lens 131 to the spatial light modulator 12, it is possible to prevent the zeroth order light beam reflected by the spatial light modulator 12 from being directed to the light source 11.

There may be a case where the illumination lens 131 is arranged at a position which is away from a plane where the spatial light modulator 12, the zoom lens 133 and the like are located, and a mirror for directing a luminous flux passing through the illumination lens 131 to the spatial light modulator 12 is arranged. In such a case, since a luminous flux of the light directed from the illumination lens 131 to the spatial light modulator 12 does not coincide with that of light which is reflected by the spatial light modulator 12 and directed to the zoom lens 133 and the like, it is not necessary to arrange an optical path separator such as the prism 132 within the luminous flux of the light directed from the illumination lens 131 to the spatial light modulator 12.

Figure 3:
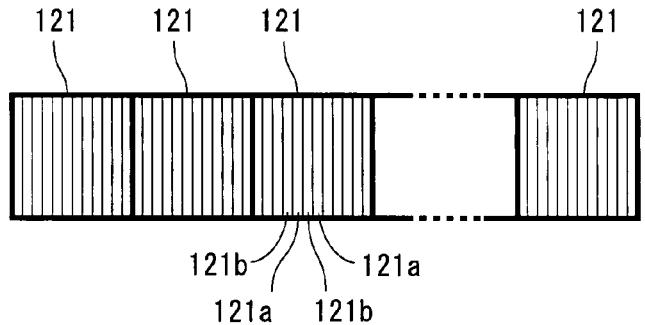
FIG. 3 is an enlarged view of light modulator elements which are arranged.

FIG. 3 is an enlarged view of the plurality of light modulator elements 121 in the spatial light modulator 12 of diffraction grating type. The light modulator elements 121 are linearly arranged in the spatial light modulator 12. Each light modulator element 121 is a diffraction grating whose grating depth is changeable, and it is manufactured with the semiconductor device manufacturing technique. In each light modulator element 121, a plurality of moving ribbons 121*a* and a plurality of fixed ribbons 121*b* are alternately arranged in parallel along a width direction of the ribbons, and the moving ribbons 121*a* are vertically movable with respect to a base surface therebehind and the fixed ribbons 121*b* are fixed with respect to the base surface. As the light modulator element with diffraction grating structure, for example, the GLV (Grating Light Valve) (trademarked by Sillicon Light Machine, Sunnyvale, Calif.) is well known.

Figure 4A:
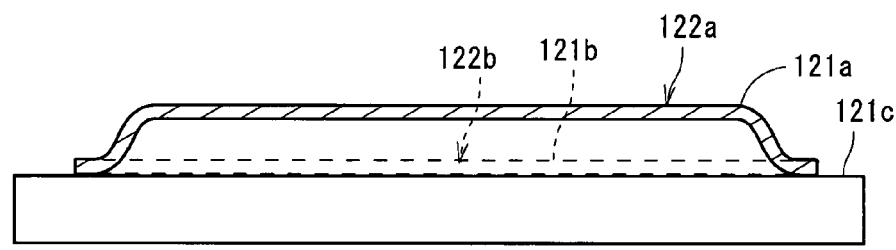
FIGS. 4A and 4B are cross sections of the light modulator element.
Figure 4B:
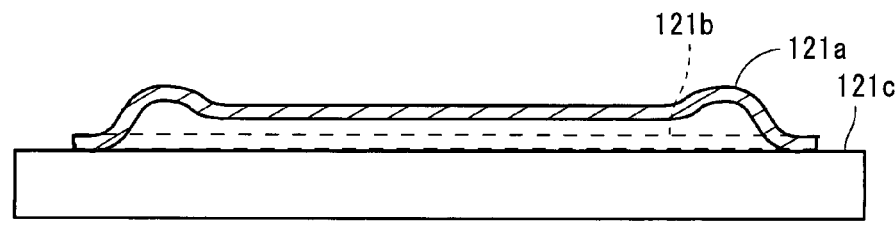

FIGS. 4A and 4B are longitudinal sectional views where a moving ribbon 121*a* is cut by a plane parallel to its longitudinal direction, and the fixed ribbon 121*b* is shown by a broken line. The upper surface of the moving ribbon 121*a* is a strip-like moving reflective surface 122*a* parallel to a base surface 121*c* which is the upper surface of a substrate, and the upper surface of the fixed ribbon 121*b* is a strip-like fixed reflective surface 122*b* parallel to the base surface 121*c*. FIG. 4A shows an initial state where the moving ribbons 121*a* are not sagged and FIG. 4B shows a state where a voltage (electric potential difference) is applied between the moving ribbons 121*a* and the base surface 121*c* and the moving ribbons 121*a* are sagged toward the base surface 121*c* by electrostatic force. Since the fixed ribbons 121*b* are formed on the base surface 121*c*, a height of the moving reflective surfaces 122*a* from the base surface 121*c* is different from that of the fixed reflective surfaces 122*b* from the base surface 121*c* in a state where the moving ribbons 121*a* are not sagged as shown in FIG. 4A.

Figure 5A:
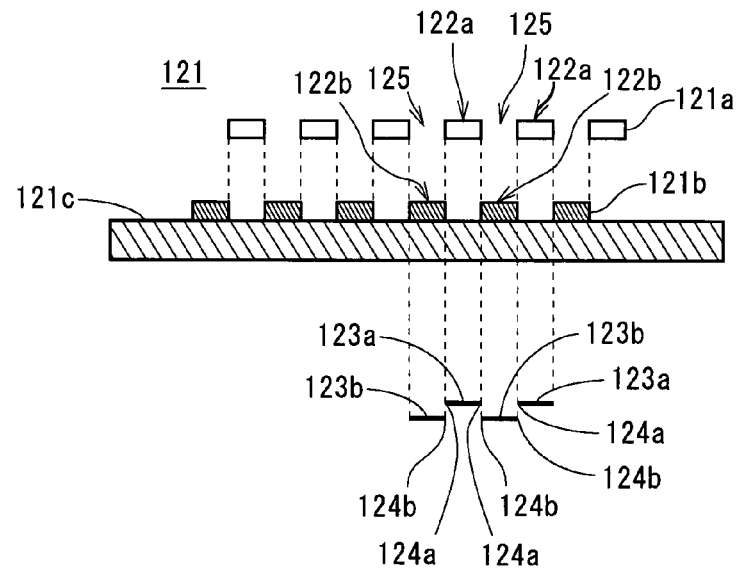
FIGS. 5A to 5C are cross sections of the light modulator element.
Figure 5B:
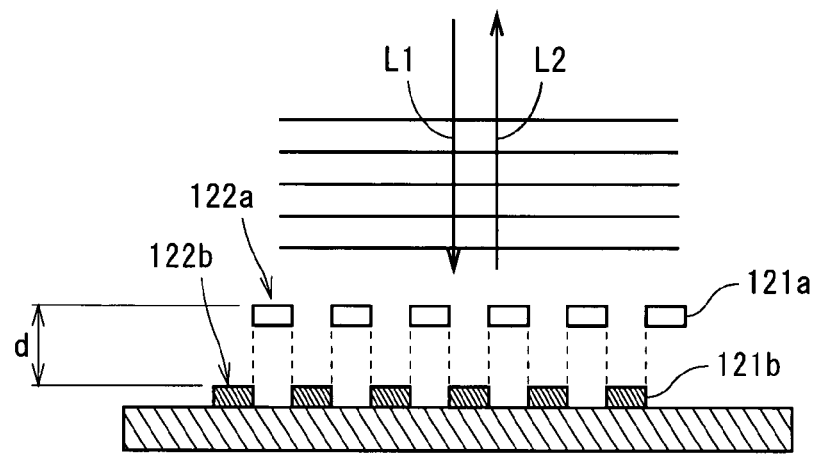
Figure 5C:
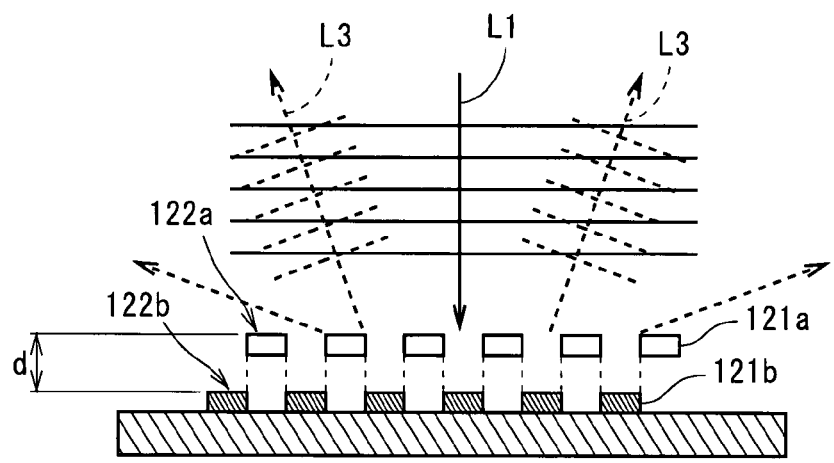

FIGS. 5A, 5B and 5C are views showing cross sections of the light modulator element 121 which is cut by a plane perpendicular to the moving ribbons 121a and the fixed ribbons 121b. As shown in FIG. 5A, the moving ribbon 121a and the fixed ribbon 121b have the approximately same width. Under the assumption of areas which are projections of the moving reflective surfaces 122a onto the base surface 121c (each area is on the base surface 121c, which corresponds to a range indicated by the reference sign 123a, and it is hereinafter referred to as "a first area 123a") and areas which are projections of the fixed reflective surfaces 122b onto the base surface 121c (each area is on the base surface 121c, which corresponds to a range indicated by the reference sign 123b, and it is hereinafter referred to as "a second area 123b"), each edge 124a, extending in the longitudinal direction, of the first areas 123a (the edge extends in a direction perpendicular to the width direction of the ribbons (i.e., the arrangement direction of the ribbons), being vertical to a sheet) is overlapped with an edge 124b, extending in the longitudinal direction, of the second areas 123b. A width of each moving ribbon 121a and that of each fixed ribbon 121b can be optimized in consideration of a contrast or a reflectance. In this case, the width of the moving ribbon 121a and that of the fixed ribbon 121b are slightly different from each another.

FIG. 5B is a view showing a state where the moving ribbons 121a are slightly sagged and a difference d of the height between the moving reflective surfaces 122a and the fixed reflective surfaces 122b is $(2n/4)\lambda$ ($\lambda$ is a wavelength of an incident light beam L1). In the state of FIG. 5B, a zeroth order light beam L2 with the maximum light-amount (i.e., the maximum intensity) is outputted from the light modulator element 121. FIG. 5C is a view showing a state where the moving ribbons 121a are further sagged and the difference d of the height between the moving reflective surfaces 122a and the fixed reflective surfaces 122b is $((2n-\frac{1}{4})\lambda$. In the state of FIG. 5C, a light amount of (+/−) first order diffracted light beams L3 (further, high-order diffracted light beams) outputted from the light modulator element 121 becomes maximum and a light amount of the zeroth order light beam becomes minimum.

As discussed above, the moving ribbons 121a sag in accordance with an inputted voltage to change the height of the moving reflective surfaces 122a from the base surface 121c, and the light modulator element 121 changes between the state of emitting the zeroth order light beam and that of the first order diffracted light beams. The height of the moving reflective surfaces 122a from the base surface 121c is different from that of the fixed reflective surfaces 122b from the base surface 121c in a state where the moving ribbons 121a are not sagged, the light amount of the zeroth order light beam becomes maximum in a state of sagging the moving ribbons 121a, and the light amount of the zeroth order light beam becomes minimum while that of the first order diffracted light beams becomes maximum in a state of further sagging the moving ribbons 121a. Since the light modulator element 121 is designed so that the light amount of the zeroth order light beam becomes maximum when the moving ribbons 121a are sagged at a certain degree, it is possible to surely obtain the maximum light-amount by a low input voltage without influence of errors in manufacturing.

Any clearance does not exist between the first areas 123a which are projections of the moving reflective surfaces 122a onto the base surface 121c and the second areas 123b which are projections of the fixed reflective surfaces 122b onto the base surface 121c. As shown in FIG. 5A, the moving reflective surfaces 122a of the moving ribbons 121a and clearances 125 having the approximately same width as the moving reflective surfaces 122a alternately exist on the upper surface of the light modulator element 121. As a result, it is possible to make an extinction ratio larger, which is a ratio of the light amount of the zeroth order light beam in the ON state to that of the zeroth order light beam in the OFF state. Larger extinction ratio makes it possible to appropriately perform writing (which can be regarded as a kind of transfer of light signals) and improve a reflectance (diffraction efficiency of the zeroth order light beam), therefore, the light modulator element 121 is a light modulator element of diffraction grating type where improvement of the extinction ratio is realized.

Figure 6:
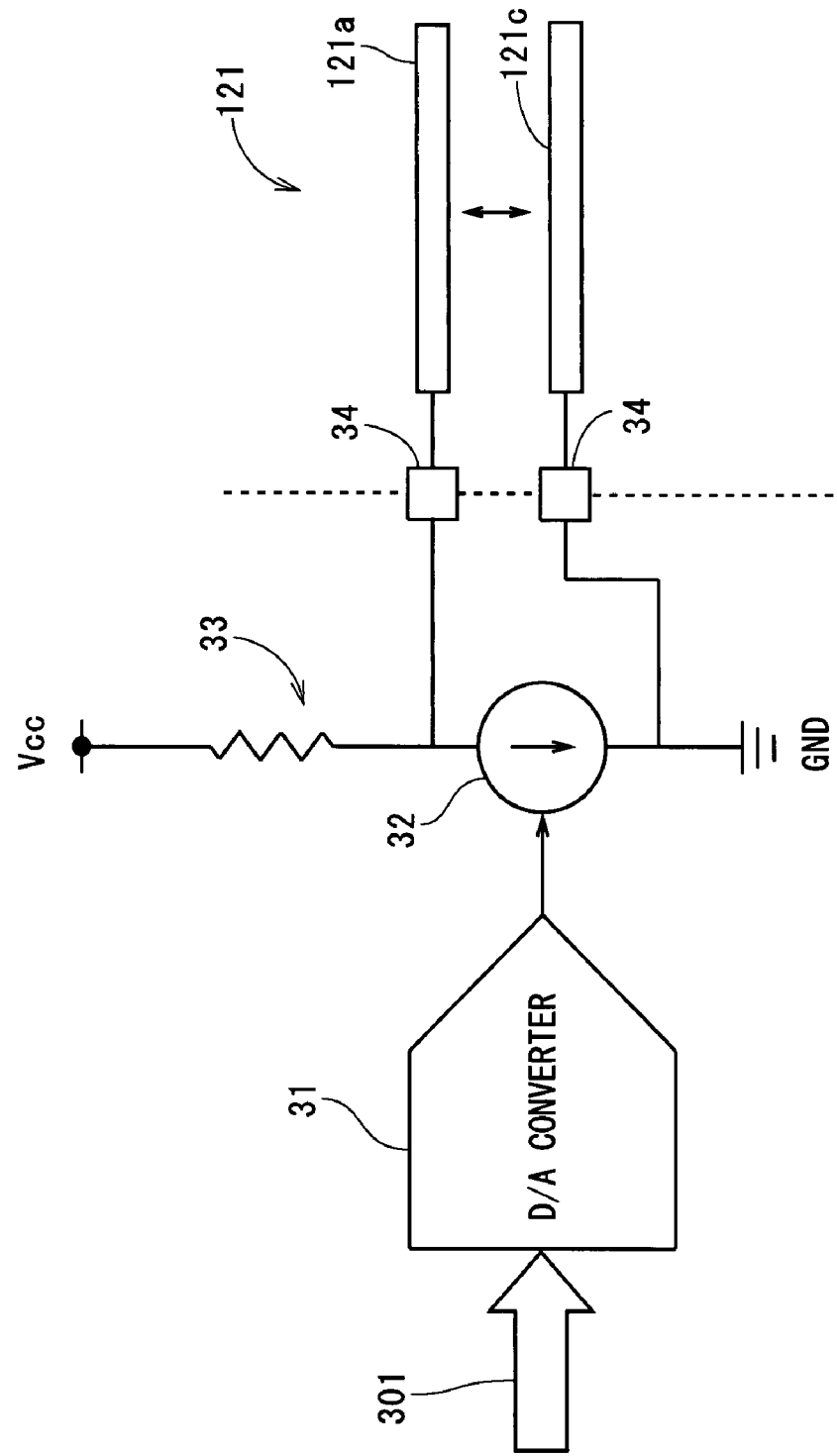
FIG. 6 is a view showing a constitution for driving the light modulator element.

FIG. 6 is a view showing a structure for driving each light modulator element 121. In driving the light modulator element 121, a driving voltage data 301 which is a digital signal is inputted to a D/A converter 31 and the driving voltage data 301 is converted into an analog signal in accordance with a predetermined clock signal. The analog signal is inputted to a current source 32 and further converted into a current.

One end of the current source 32 is connected to the side of high potential Vcc through a resistance 33 and the other end is grounded. Both ends of the current source 32 are connected to the moving ribbons 121a of the light modulator element 121 and the base surface 121c through connecting pads 34. When the output from the D/A converter 31 is converted into the current through the current source 32, it is further converted into an actual driving voltage between the both connecting pads 34 by a voltage drop of the resistance 33. Since there is stray capacitance between the connecting pads 34, the actual driving voltage changes in accordance with the time constant and gradually goes toward a target driving voltage indicated by the driving voltage data 301. With this operation, a voltage in accordance with the driving voltage data 301 is inputted to the light modulator element 121 and it is possible to arbitrarily change a depth of grating in the light modulator element 121.

Figure 7:
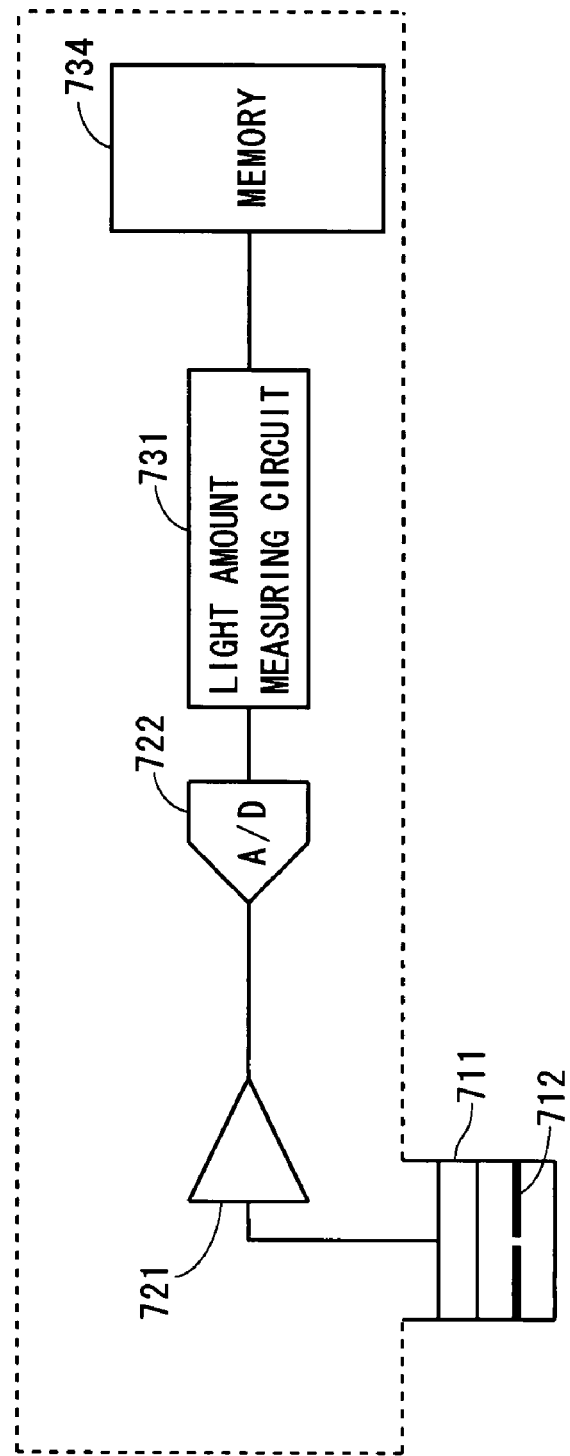
FIG. 7 is a view showing a constitution of a light amount measurement part.

FIG. 7 is a view showing a construction of the light amount measurement part 71. The light amount measurement part 71 comprises a photosensor 711 which is a photodetector for converting light from the optical head 10 into an electrical analog signal, and a slit 712 opposed to the optical head 10 is located on the side of the photosensor 711 (see FIG. 1). The photosensor 711 is connected to an amplifier 721 and the amplifier 721 is connected to an A/D converter 722, a light amount measuring circuit 731 and a memory 734 in this order. An output from the photosensor 711 is converted into digital data in the A/D converter 722 through the amplifier 721, it is further converted into a value representing a light amount in the light amount measuring circuit 731, and then an output from the light amount measuring circuit 731 is stored in a memory 734.

Figure 8:
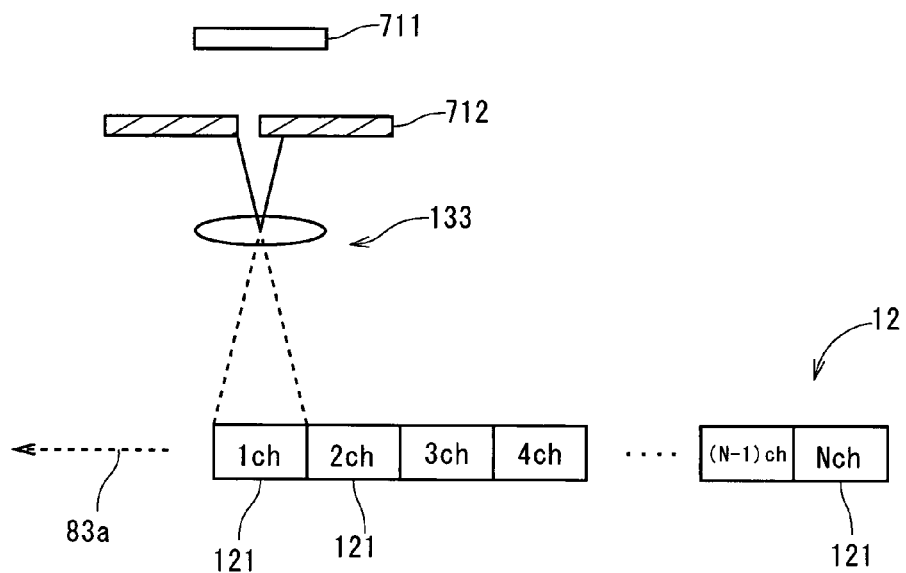
FIG. 8 is a view showing a state of measurement of light amount.

FIG. 8 is a view showing a state where measurement of light amounts is performed by the light amount measurement part 71. In measurement of light amounts, the optical head 10 moves up to the position opposite to the light amount measurement part 71 as shown by dash-double-dot lines in FIG. 1, and the slit 712 is located at a position which is conjugate with the plurality of light modulator elements 121 through the zoom lens 133 and the like (i.e., spot images of the light modulator elements 121 are formed at the position). A dimmer means (neutral density filter), a lens, or the like for optimizing sensitivity of the light amount measurement part 71 and the size of the spot images of the light modulator elements 121 relative to the slit 712 may be arranged between the slit 712 and the plurality of light modulator elements 121. In FIG. 8, each light modulator element 121 is shown by a block and a channel number corresponding to each light modulator element 121 is described in the block. After all light modulator elements 121 are brought into the ON state, the optical head 10 moves relatively to the slit 712 in a direction indicated by an arrow 83a (it is a direction corresponding to the arrangement direction of the light modulator elements 121, i.e., the sub scan direction in writing). In other words, the motor 82 and the ball screw 83 shown in FIG. 1 function as a slit moving mechanism for moving the slit 712 relatively to the light modulator elements 121.

Figure 9:
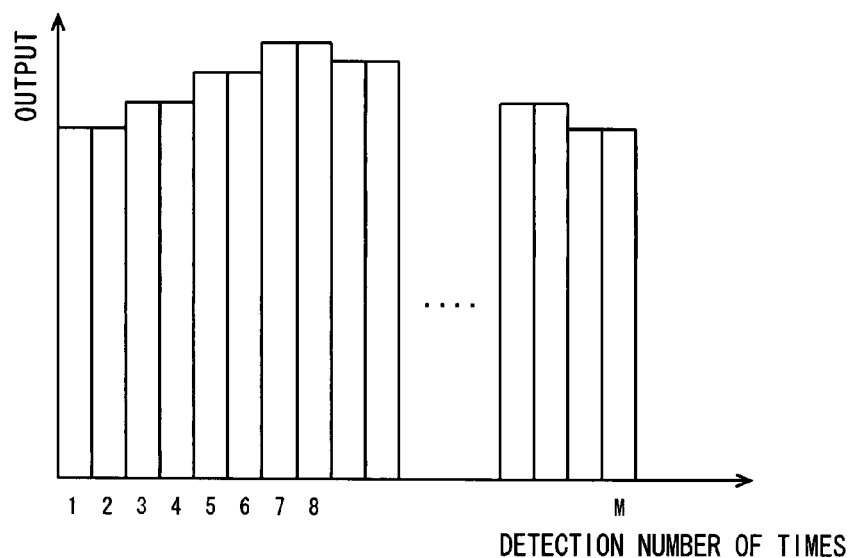
FIG. 9 is a graph illustrating exemplary results of measurement of light amounts.

A width of a clearance (exactly, a width of a clearance in the sub scan direction) which is formed in the slit 712 is made half of a width in the sub scan direction of a spot image of one light modulator element 121 (the width of the clearance is not limited to be half of a spot image but may be narrower than that of the spot image). While the optical head 10 moves by a width of a spot image of one light modulator element 121, the A/D converter 722 shown in FIG. 7 converts output from the photosensor 711 twice. With this operation, an output distribution illustrated in FIG. 9 is obtained. In FIG. 9, detection number of times of 1 and 2 represent output obtained from the first light modulator element 121, detection number of times of 3 and 4 represent output obtained from the second light modulator element 121, and detection number of times of (M−1) and M represent output obtained from the N-th light modulator element 121 (M is a value twice N). In the light amount measuring circuit 731, an average of two outputs illustrated in FIG. 9 is obtained to further perform a computation for converting the average into a light amount from the light modulator element 121. The obtained light amount in each channel is stored in the memory 734 for a while, and thereafter it is transmitted to the target voltage obtaining part 24 shown in FIG. 1.

Figure 10:
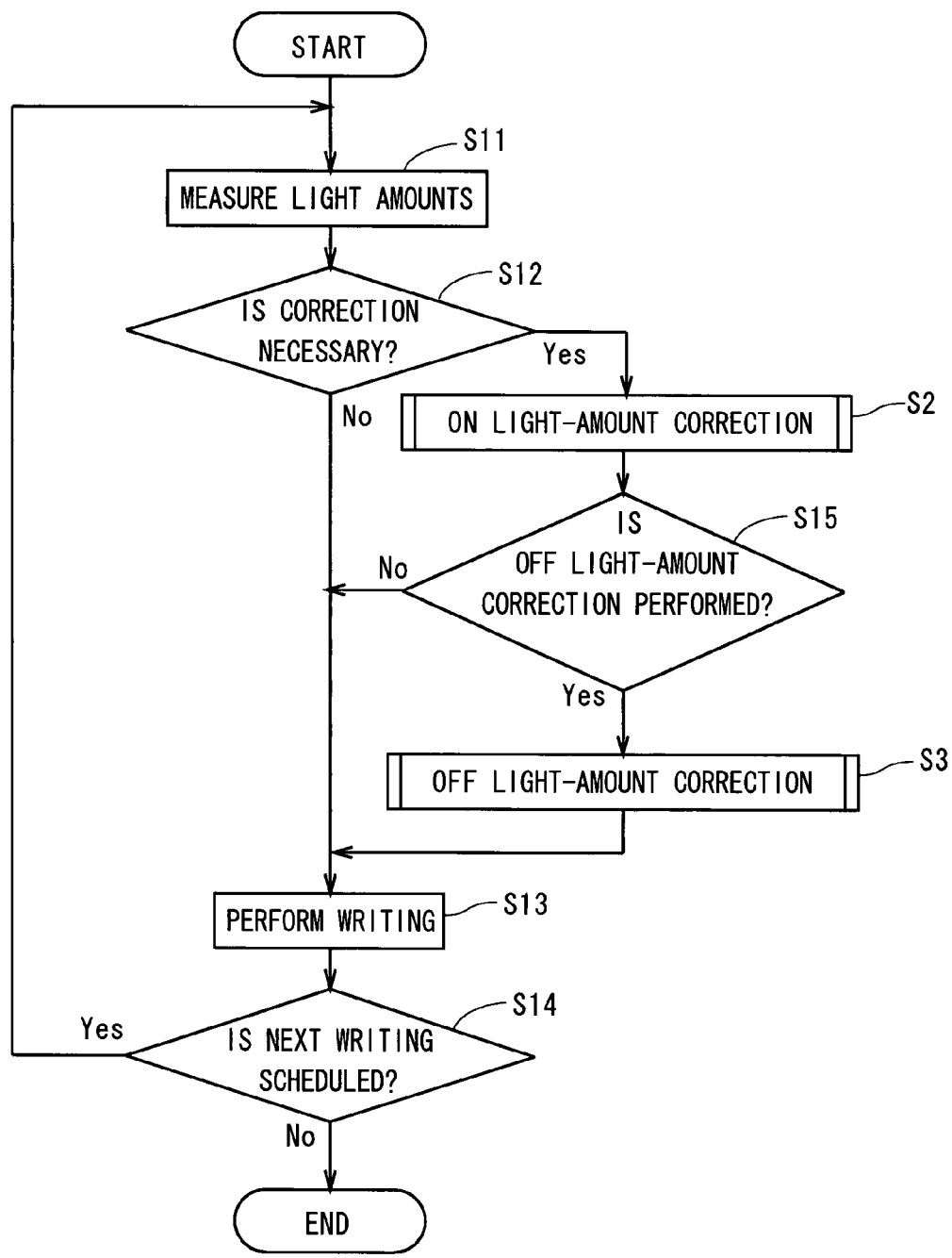
FIG. 10 is a flowchart showing an operation flow of the image recording apparatus.

FIG. 10 is a flowchart showing an operation flow of the image recording apparatus 1. In the image recording apparatus 1, driving voltage data after correcting (hereinafter, referred to as "corrected data"), which is used for outputting light with a constant light amount in a state where each light modulator element 121 is brought into the ON state, is stored in the target voltage obtaining part 24 of FIG. 1, and it is confirmed whether or not modification of the corrected data is necessary before image recording. As discussed later, driving voltage data after correcting for a state where each light modulator element 121 is brought into the OFF state may be included in the corrected data.

In confirmation of the corrected data, first, the optical head 10 moves up to the position opposite to the light amount measurement part 71 as shown by dash-double-dot lines in FIG. 1 and corrected data is read out from the target voltage obtaining part 24 to the general control part 21. All light modulator elements 121 are brought into the ON state on the basis of the corrected data through control of the general control part 21 and the signal processing part 22, and light amounts of output lights from light modulator elements 121 are sequentially measured (Step S11). In a case where unevenness in light amounts of the light modulator elements 121 fall within an allowable range, it is determined modification of the corrected data is not necessary (Step S12) and the general control part 21 and the signal processing part 22 perform writing which includes correction of light amounts (Step S13).

Specifically, the recording material 9 moves relatively to the plurality of light modulator elements 121, by rotating the holding drum 70, in a constant speed in a direction perpendicular to an arrangement direction of positions irradiated with light from the light modulator elements 121 while the plurality of light modulator elements 121 output lights which are ON/OFF controlled. The optical head 10 moves in the sub scan direction in synchronization with rotation of the holding drum 70 to record an image on the whole recording material 9. In a state where each light modulator element 121 is brought into the ON state, the driving voltage data 301 after correcting is inputted to the D/A converter 31 shown in FIG. 6. When modification is performed in a state where each light modulator element 121 is brought into the OFF state, the driving voltage data 301 after correcting which indicates the OFF state is inputted to the D/A converter 31. The moving direction (main scan direction) of the outer surface of the holding drum 70 (i.e., the moving direction of the recording material 9) is not required to be perpendicular to the arrangement direction of the positions irradiated with light but may be a direction crossing the arrangement direction.

When an image recording of one recording material 9 is finished and the next image recording is scheduled, the recording material on the holding drum 70 is replaced and the operation is returned back to Step S11 (measurement of light amounts) (Step S14). As discussed above, before an image is recorded on each recording material 9, i.e., before image recording, an output light-amount outputted from each light modulator element 121 is surely measured and necessity of modification of the corrected data (necessity of a process of obtaining target ON-voltages (and target OFF-voltages) which are described later) is confirmed in the image recording apparatus 1.

On the other hand, in a case where it is determined unevenness in the light amounts of the light modulator elements 121 is over the allowable range in Step S12, ON light-amount correction for obtaining the corrected data, where the light amount of the output light (the zeroth order light beam in the preferred embodiment) from each light modulator element 121 in the ON state is made constant, is performed (Step S2) and the operation goes to writing. Also, when it is determined OFF light-amount correction, where the light amount of the output light (the zeroth order light beam) leaking out from each light modulator element 121 in the OFF state is made constant, is necessary in accordance with a kind of the recording material 9 (Step S15), the OFF light-amount correction is performed (Step S3) and the operation goes to writing.

In the image recording apparatus 1, the general control part 21, the target voltage obtaining part 24, the light amount measurement part 71, the light source 11 in the optical head 10 and the like function as a correction device for correcting output light-amounts outputted from the spatial light modulator 12, and the ON light-amount correction and the OFF light-amount correction in FIG. 10 are carried out by the general control part 21, the signal processing part 22, and the target voltage obtaining part 24.

Figure 11:
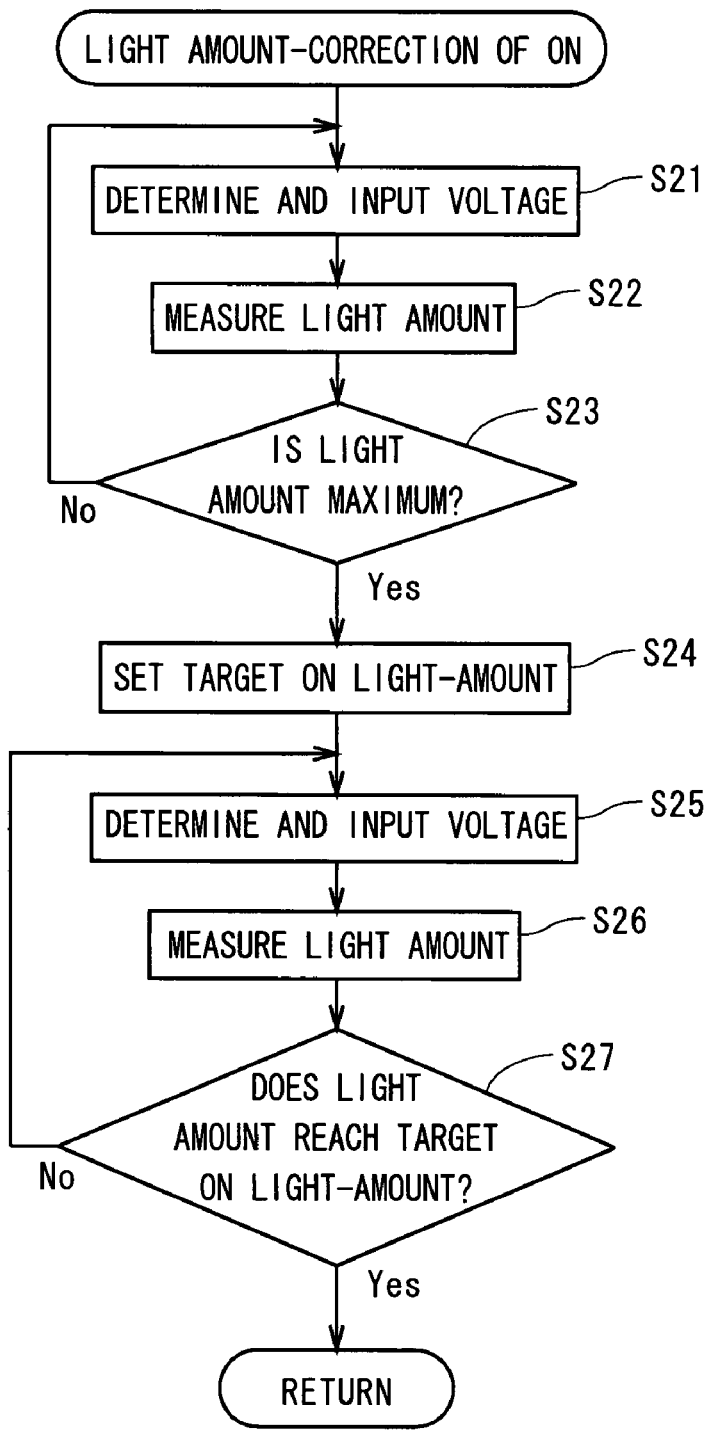
FIG. 11 is a flowchart showing an operation flow of ON light-amount correction.
Figure 12:
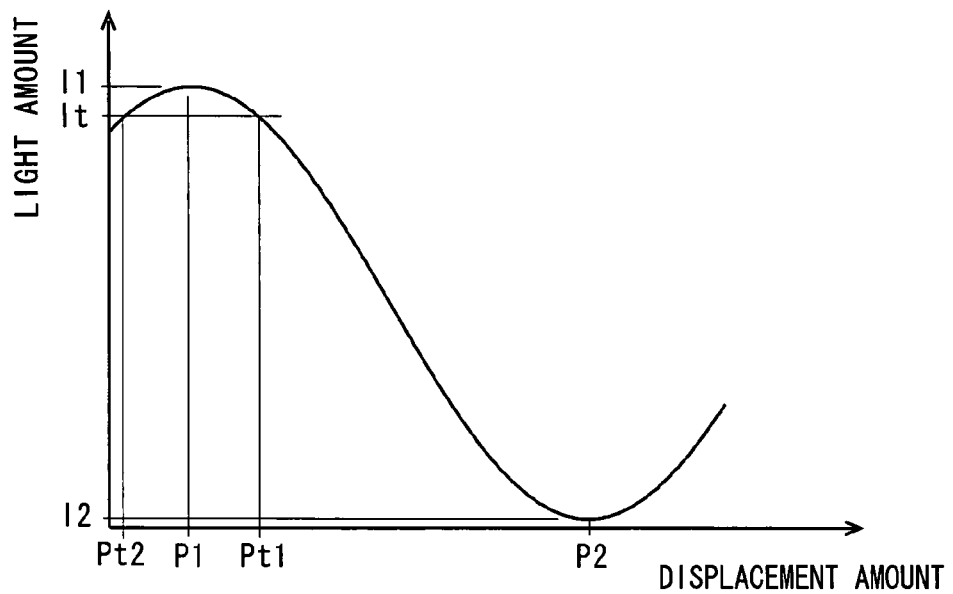
FIG. 12 is a graph showing a relationship between displacement amount of moving ribbon and output light-amount.

FIG. 11 is a flowchart showing an operation flow of the ON light-amount correction, and FIG. 12 is a graph showing a relationship between displacement amount (amount of sagging) of the moving ribbon 121a in one light modulator element 121 and light amount of an output light. Steps S21 to S23 and S25 to S27 in FIG. 11 are performed on each element. In FIG. 12, even if the displacement amount of the horizontal axis is replaced with an input voltage, the almost same curve as in FIG. 12 is obtained. In the following description, a voltage inputted to the light modulator element 121 is always positive or 0 but may be always negative or 0. Therefore, a voltage is high (or a value is large) means the absolute value of the voltage is large in the following description.

As discussed above, the maximum light amount-voltage inputted to the light modulator element 121 when the output light-amount becomes maximum, is lower than the minimum light amount-voltage which is inputted to the light modulator element 121 when the output light-amount becomes minimum in the light modulator element 121. The output light-amount becomes the maximum value I1 at the displacement amount P1 where the moving ribbons 121a are slightly sagged and conversely, the output light-amount becomes the minimum value I2 at the displacement amount P2 where the moving ribbons 121a are further sagged. A process of obtaining the maximum light amount-voltage, which is inputted to the light modulator element 121 when the light amount first becomes the maximum value I1 (hereinafter, referred to as "first maximum light-amount"), is performed in the ON light-amount correction.

Looking at one light modulator element 121, in the operation for obtaining the maximum light amount-voltage, first, 0 is inputted to the light modulator element 121 as the initial voltage (Step S21) and an output light-amount is acquired from the light modulator element 121 in a state where the moving ribbons 121a are not sagged (Step S22). The input voltage is slightly increased to perform measurement of light amount of the light modulator element 121 (Steps S21, S22), and increase of the output light-amount is confirmed (Step S23). Thereafter, measurement of light amount and confirmation of increase of light amount are repeated while slightly increasing the input voltage (Steps S21 to S23), and an input voltage when the output light-amount starts to decrease is determined as the maximum light amount-voltage (Step S23).

With the above operation, the first maximum light-amount when the output light-amount first becomes maximum from when the moving ribbons 121a start to sag in each light modulator element 121 and the maximum light amount-voltage which is inputted to each light modulator element 121 at the first maximum light-amount, are obtained. In the actual process, after determination of the input voltages to all light modulator elements 121, measurement of light amounts on light modulator elements 121 are continuously performed to efficiently obtain the maximum light amount-voltages for light modulator elements 121.

Figure 13:
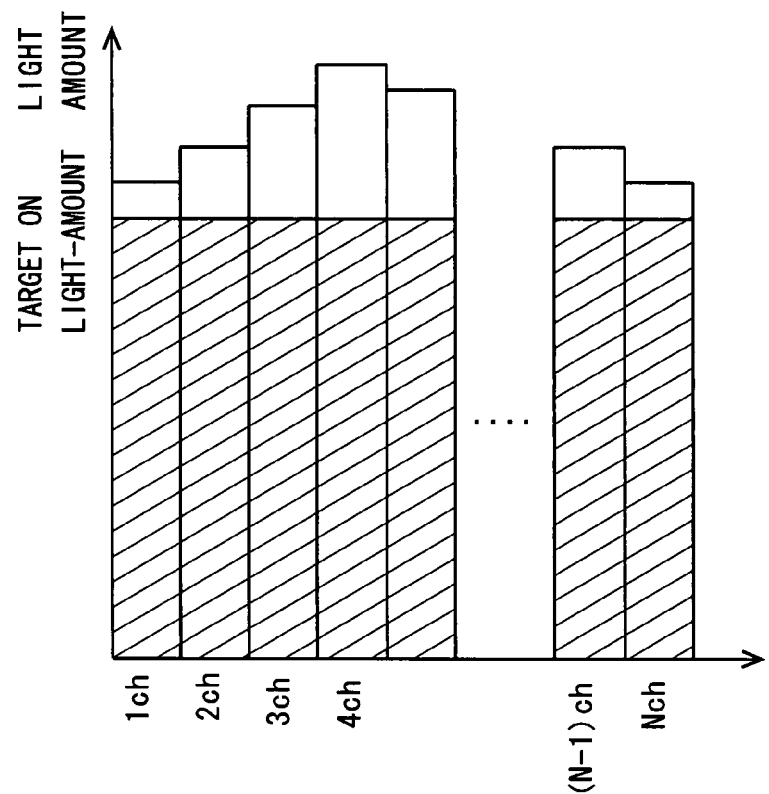
FIG. 13 is a graph showing a distribution of the first maximum light-amounts.

FIG. 13 is a graph showing the first maximum light-amounts of all light modulator elements 121, i.e., all channels. The first maximum light-amounts are not normally uniform because of nonuniformity of illumination light, variations in physical properties among the light modulator elements 121, or the like. When the first maximum light-amounts of all light modulator elements 121 are obtained, the minimum of the first maximum light-amounts is set as a target light-amount (hereinafter, referred to as "target ON light-amount") as shown in FIG. 13 (Step S24). Then, the operation goes to a process of obtaining target voltages (hereinafter, referred to as "target ON-voltages") which are inputted to light modulator elements 121, respectively, when the output light-amounts from the light modulator elements 121 become the target ON light-amount.

Looking at one light modulator element 121, in acquisition of the target ON-voltage, first, the maximum light amount-voltage is inputted to the light modulator element 121 as the initial voltage (Step S25) and a light amount of an output light is acquired from the light modulator element 121 (Step S26). The input voltage is slightly increased and measurement of light amount is performed (Steps S25, S26) and it is confirmed whether or not the output light-amount reaches the target ON light-amount, i.e., the difference between the output light-amount and the target ON light-amount is equal to or smaller than a predetermined value (Step S27). Then, measurement of light amount and confirmation of output light-amount are repeated while slightly increasing the input voltage, until the output light-amount first reaches the target ON light-amount (Steps S25 to S27). When the output light-amount reaches the target ON light-amount, the input voltage at this point is determined as the target ON-voltage (Step S27). The target ON-voltage of each light modulator element 121 is stored in the target voltage obtaining part 24 as a part of the corrected data. In the actual process, after determination of the input voltages to all light modulator elements 121, measurement of light amounts on light modulator elements 121 are continuously performed to efficiently obtain the target ON-voltages for light modulator elements 121.

The above method of obtaining the target ON-voltage is a so-called sequential search and next discussion will be made on a more preferable method of obtaining the target ON-voltage (so-called binary search) with reference to one light modulator element 121. In the method, first, a first voltage which is surely over the target ON-voltage (and surely falls below the minimum light amount-voltage) is appropriately set and an average of the first voltage and the maximum light amount-voltage is obtained as a second voltage which is inputted to the light modulator element 121. The second voltage is inputted to the light modulator element 121 (Step S25) and an output light-amount of the light modulator element 121 is measured (Step S26).

Next, it is confirmed whether or not the difference between the output light-amount and the target ON light-amount falls within an allowable range (Step S27). When the difference is out of the allowable range, a half of the difference between the first voltage and the second voltage is added or subtracted to/from the second voltage so that the output light-amount gets closer to the target ON light-amount, to obtain an updated second voltage. That is to say, the half of the difference between the first voltage and the second voltage is subtracted from the second voltage in a case where the output light-amount is below the target ON light-amount, and the half of the difference between the first voltage and the second voltage is added to the second voltage in a case where the output light-amount is over the target ON light-amount. Further, the second voltage, which has a value before updating, is updated to a first voltage. Input of the updated second voltage to the light modulator element 121 and measurement of light amount are repeated (Steps S25, S26) and it is confirmed whether or not the output light-amount reaches the target ON light-amount (Step S27).

Update of the first voltage and the second voltage, measurement of light amount, and confirmation of output light-amount are repeated, and when the difference between the output light-amount and the target ON light-amount falls within the allowable range, the second voltage at this point is determined as the target ON-voltage (Step S27). It is possible to obtain the target ON-voltage more rapidly by using the binary search.

Though the first maximum light-amount is obtained for each light modulator element 121 and the target ON light-amount is determined on the basis of the first maximum light-amounts in the above-discussed operation, the target ON light-amount may be obtained without using the first maximum light-amounts of respective light modulator elements 121.

Figure 14:
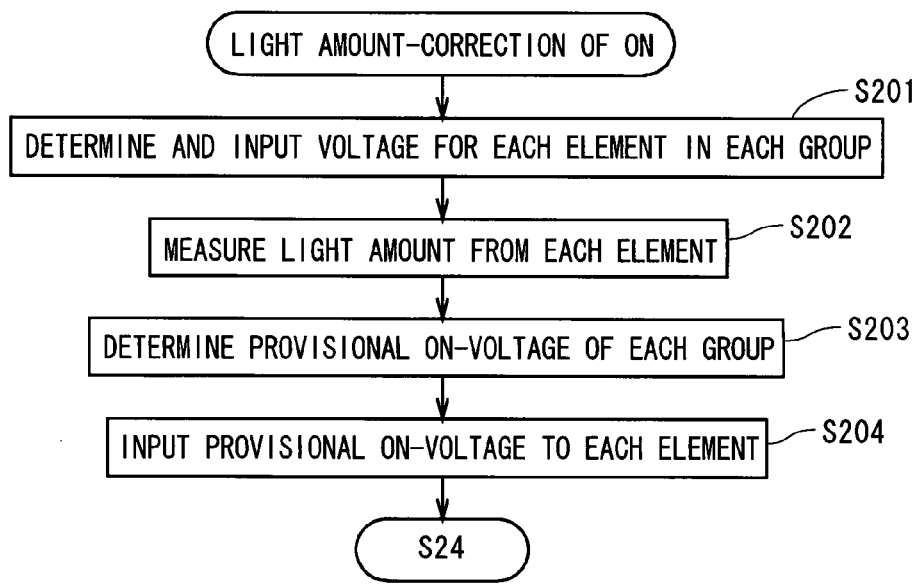
FIG. 14 is a flowchart showing another example for obtaining a target ON light-amount.

FIG. 14 is a flowchart showing an operation flow for rapidly obtaining provisional voltages (hereinafter, referred to as "provisional ON-voltages") which are used for acquiring an output closer to the first maximum light-amount, to subsequently set the target ON light-amount to be outputted in the ON state. Processes after Step S204 in FIG. 14 are the same as those after Step S24 in FIG. 11.

In obtaining the provisional ON-voltages, first, the plurality of light modulator elements 121 of the spatial light modulator 12 are divided into groups by a predetermined number where the light modulator elements 121 are continuously arranged, and a plurality of voltages which gradually increase are determined for (a plurality of) light modulator elements 121 in each group, and they are inputted to the light modulator elements 121 in each group, respectively (Step S201). All light modulator elements 121 of the spatial light modulator 12 may be considered as one group. The lowest voltage and the electric potential difference between adjacent light modulator elements 121 are determined in advance so that the (predicted) maximum light amount-voltage of any light modulator element 121 is surely included within a voltage range applied to the light modulator elements 121 belonging to one group.

Figure 15:
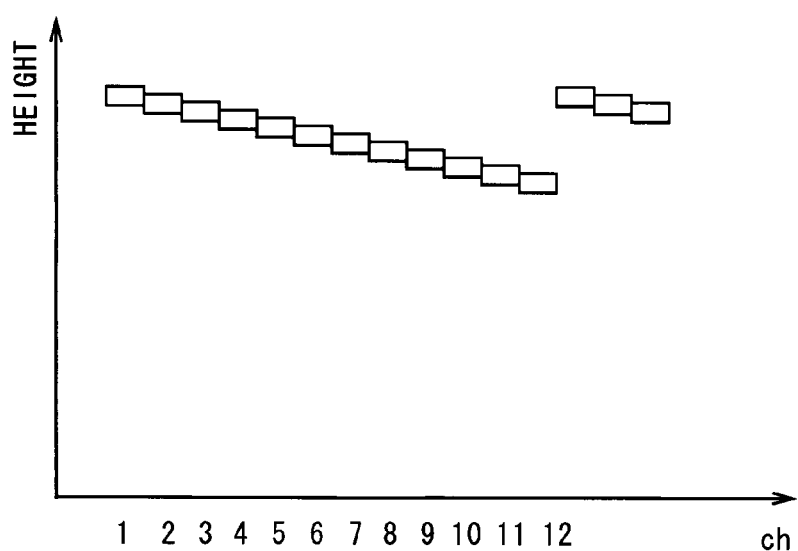
FIG. 15 is a view showing heights of moving ribbons in a case where voltages gradually increasing are applied to a plurality of light modulator elements in turn.

FIG. 15 is a view showing heights of the moving ribbons 121a from the base surface 121c, where twelve light modulator elements 121 are considered as one group and voltages which gradually increase are applied to the twelve light modulator elements 121 in turn. In FIG. 15, the height of the plurality of moving ribbons 121a in one light modulator element 121 is shown by one box. Since different voltages are applied to the light modulator elements 121 in one group, the height of the moving ribbons 121a decreases in accordance with increase of channel number according to the input voltage as shown in FIG. 15.

Figure 16:
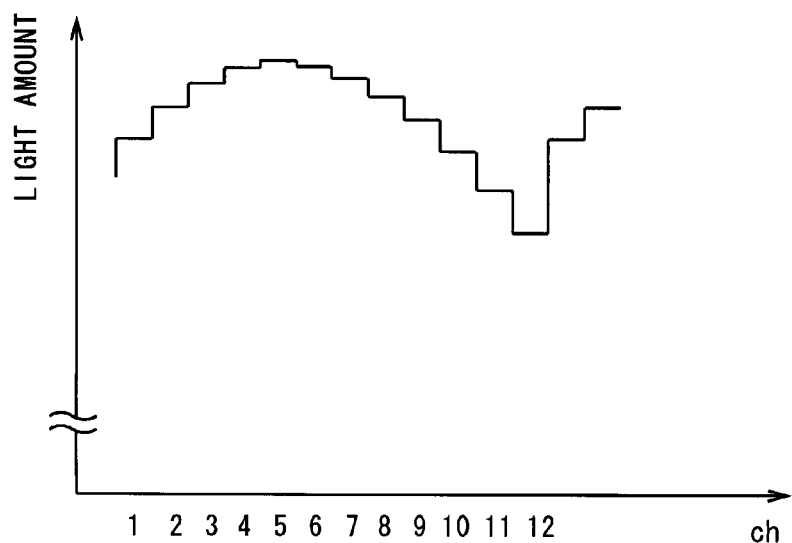
FIG. 16 is a view showing output light-amounts outputted from the plurality of light modulator elements shown in FIG. 15.

Next, the output light-amounts from the light modulator elements 121 in each group are measured (Step S202). FIG. 16 is a view showing measurement results of the output light-amounts from the plurality of light modulator elements 121 in the state shown in FIG. 15. In a case of the group shown in FIG. 16, since the light amount from the light modulator element 121 of 5ch is maximum, it is presumed that the voltage applied to 5ch is closer to the maximum light amount-voltage in each light modulator element 121 of the group. Then, the voltage applied to 5ch is determined as the provisional ON-voltage which is common to the elements belonging in the above group. As described above, the provisional ON-voltage is obtained as a voltage which is common to each group (Step S203).

When the provisional ON-voltage is obtained for each group, the provisional ON-voltage of each group is inputted to the light modulator elements 121 of the group (Step S204) and measurement of light amounts is performed again. The minimum of the output light-amounts from all light modulator elements 121 is set as the target ON light-amount (FIG. 11: Step S24). The provisional ON-voltage is normally different in each group, but the target ON light-amount is obtained as a common value of all light modulator elements 121. The target ON light-amount may be a predetermined light amount or more as long as it is equal to or smaller than the minimum light-amount.

After that, the target ON-voltages are obtained from the target ON light-amount by the above-discussed method, however, the provisional ON-voltage is used instead of the maximum light amount-voltages. That is to say, looking at one light modulator element 121, first, the provisional ON-voltage of a group to which the light modulator element 121 belongs is inputted to the light modulator element 121 as the initial voltage (Step S25) and the light amount of the output light from the light modulator element 121 is acquired (Step S26). Subsequently, the input voltage is slightly increased and measurement of light amount is performed (Steps S25, S26), it is confirmed whether or not the difference between the output light-amount and the target ON light-amount is equal to or smaller than a predetermined value (Step S27), and then measurement of light amount and confirmation of output light-amount are repeated while slightly increasing the input voltage, until the output light-amount reaches the target ON light-amount (Steps S25 to S27).

There is a possibility the provisional ON-voltage is lower than the maximum light amount-voltage depending on the light modulator element 121. In a case where the output light-amount increases in accordance with increase of the input voltage, increase of the input voltage is performed until the output light-amount starts to decrease without confirmation of the difference between the output light-amount and the target ON light-amount. In another case where the output light-amount decreases in accordance with increase of the input voltage and the output light-amount falls below the target ON light-amount at the time of input of the initial voltage, measurement of light amount is performed while gradually decreasing the input voltage until the output light-amount reaches the target ON light-amount.

When the output light-amount reaches the target ON light-amount, the input voltage at this point is determined as the target ON-voltage (Step S27). It is possible to rapidly obtain the target ON light-amount and the target ON-voltage by using the provisional ON-voltage as discussed above.

Figure 17:
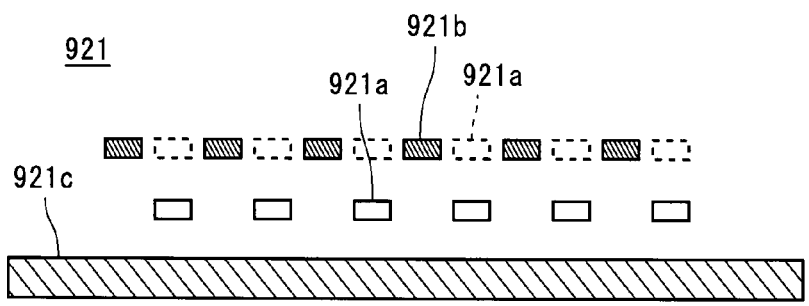
FIG. 17 is a view showing a cross section of a light modulator element in accordance with an example for comparison.
Figure 18:
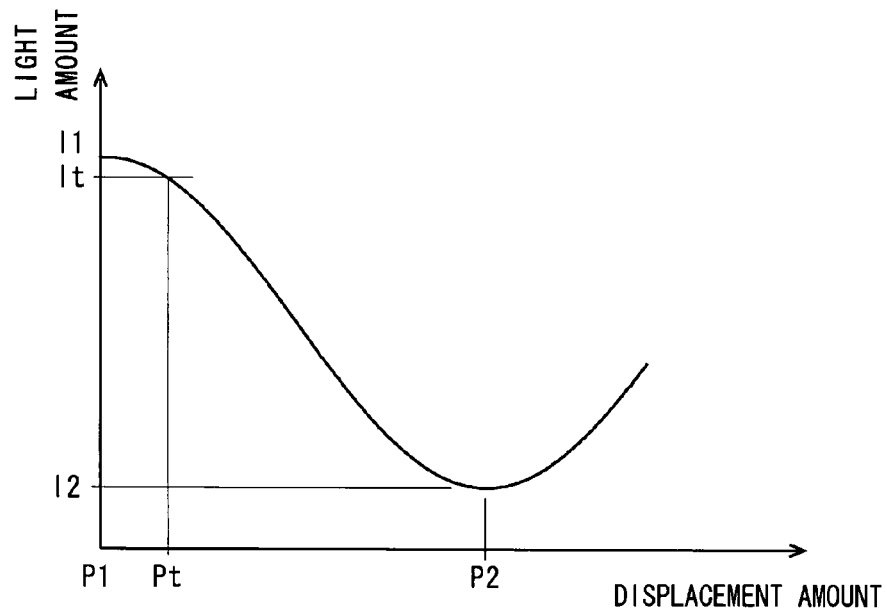
FIG. 18 is a graph showing a relationship between displacement amount of moving ribbons and output light-amount in the example for comparison.

FIG. 17 is a longitudinal sectional view of a light modulator element 921 in accordance with an example for comparison and corresponds to FIG. 5A showing the light modulator element 121. FIG. 18 is a graph showing a relationship between displacement amount of moving ribbons 921a in the light modulator element 921 and light amount of an output light which is the zeroth order light beam and it corresponds to FIG. 12. In the light modulator element 921 in accordance with the example for comparison, the height of the upper surfaces of the moving ribbons 921a from a base surface 921c is equal to that of the upper surfaces of fixed ribbons 921b from a base surface 921c in a state where the moving ribbons 921a are not sagged, as shown by broken lines, and the zeroth order light beam is outputted from the light modulator element 921. The moving ribbons 921a are sagged as shown by solid lines by applying a voltage between the moving ribbons 921a and the base surface 921c, to form a diffraction grating and output the first order diffracted light beams. Therefore, the displacement amount P1 and the maximum light amount-voltage where the maximum light-amount I1 is obtained are 0, the light amount gradually decreases in accordance with increase of the input voltage, and then the input voltage becomes the minimum light amount-voltage at the displacement amount P2 where the minimum light-amount I2 is obtained, as shown in FIG. 18.

In the case of the light modulator element 921 shown in FIG. 17, although the moving ribbons 921a and the fixed ribbons 921b are formed at the same time in manufacturing and the moving ribbons 921a and the fixed ribbons 921b are precisely made flush with each other in the initial state, small clearances appear between the moving ribbons 921a and the fixed ribbons 921b. As a result, the reflectance decreases to reduce the output light-amount at the maximum light-amount and the output light-amount leaking out at the minimum light-amount increases as shown in FIG. 18, and then an extinction ratio which is obtained by dividing the maximum light-amount by the minimum light-amount is smaller than that of the light modulator element 121 shown in FIG. 5A (i.e., the performance of the extinction ratio decreases).

In the case of FIG. 18, even if the target ON light-amount It which is slightly smaller than the first maximum light-amount I1 is set, the displacement amount Pt and the target ON-voltage, which are used for acquiring the target ON light-amount It, can be respectively obtained as one value. On the other hand, in the case of FIG. 12, two displacement amounts where the target ON light-amount It is obtained exist in the vicinity of the displacement amount P1 at the first maximum light-amount as indicated by the reference signs Pt1 and Pt2, and also two target ON-voltages where the target ON light-amount It is obtained exist in the vicinity of the maximum light amount-voltage. Only one target ON-voltage exists in a case where the target ON light-amount It is smaller than the initial light amount.

If the case where the target ON-voltage corresponding to the displacement amount Pt1 is selected and the case where the target ON-voltage corresponding to the displacement amount Pt2 is selected are mixed in the plurality of light modulator elements 121, the moving distance of the moving ribbons 121a when the light modulator element 121 is changed between the ON state and the OFF state is greatly different between the light modulator elements 121 using the both voltages.

Figure 19:
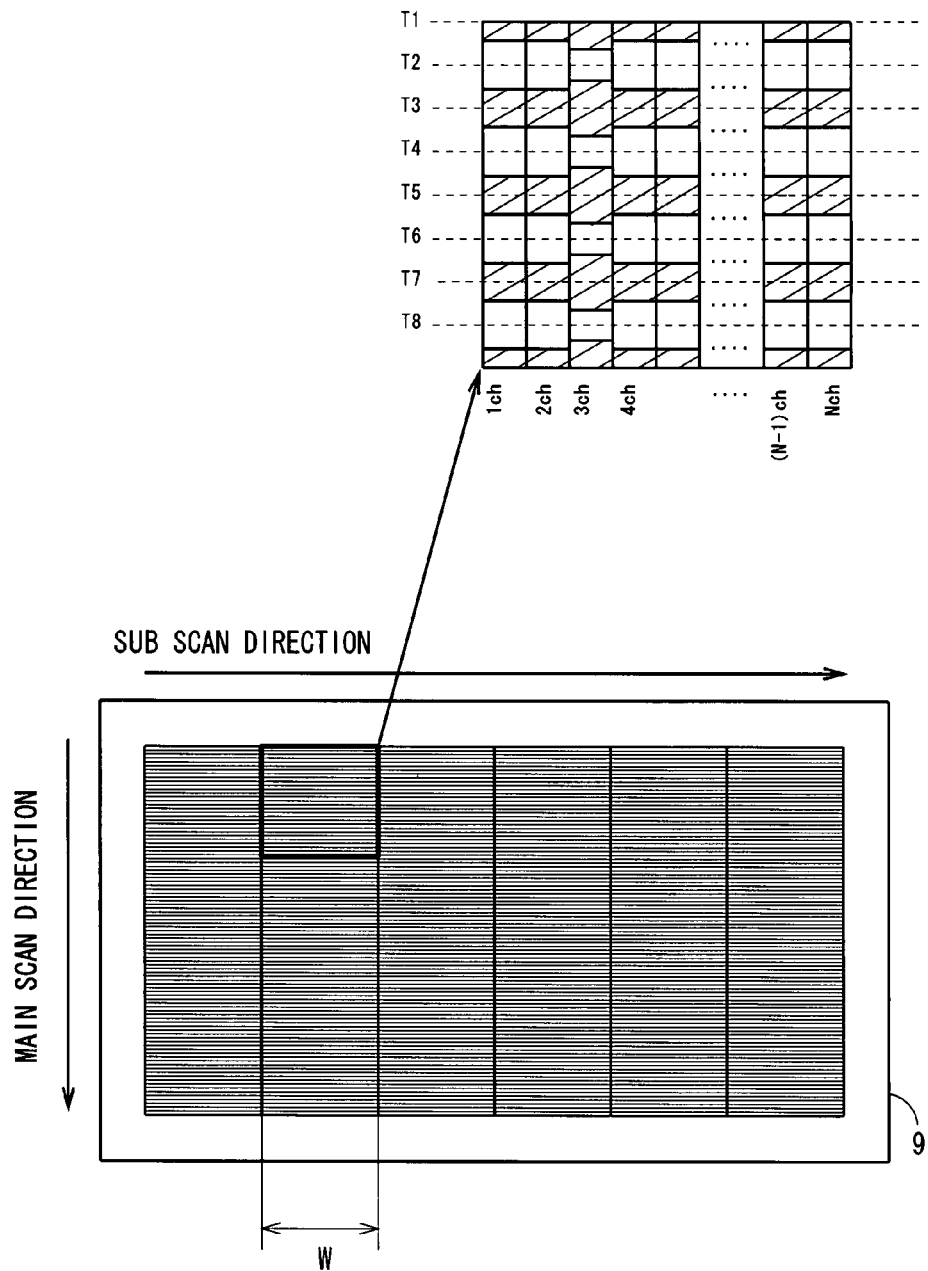
FIG. 19 is a view showing an image of horizontal 1-dot-on and 1-dot-off lines.

FIG. 19 is a view illustrating a result of writing of a plurality of lines extending in the sub scan direction, where all light modulator elements 121 are changed between the OFF state and the ON state at the same time in a case where the two target ON-voltages are mixed (hereinafter, the plurality of lines are referred to as "an image of horizontal 1-dot-on and 1-dot-off lines"). FIG. 19 shows the whole writing pattern formed on the recording material 9 and a partially enlarged writing pattern thereof (one swath, i.e., a writing region with a width W in the sub scan direction scanned by the optical head 10 through one path), and T1 to T8 are clocks used as a reference for writing.

In FIG. 19, the voltage corresponding to the displacement amount Pt2 of FIG. 12 is used as the target ON-voltage in the light modulator element 121 of 3ch and the voltage corresponding to the displacement amount Pt1 is used as the target ON-voltage in the light modulator elements 121 of other channels. The moving distance of the moving ribbons 121a when the light modulator element 121 of 3ch changes between the ON state and the OFF state is greatly different from that when the light modulator elements 121 of other channels change between the ON state and the OFF state and therefore, the thicknesses of the lines at the position of 3ch largely change.

On the other hand, in the above-discussed method of obtaining the target ON-voltages, since a voltage between the maximum light amount-voltage and the minimum light amount-voltage is surely determined as the target ON-voltage, it is prevented the image of horizontal 1-dot-on and 1-dot-off lines from greatly changing and consequently prevented unevenness appearing in a recorded image.

Figure 20:
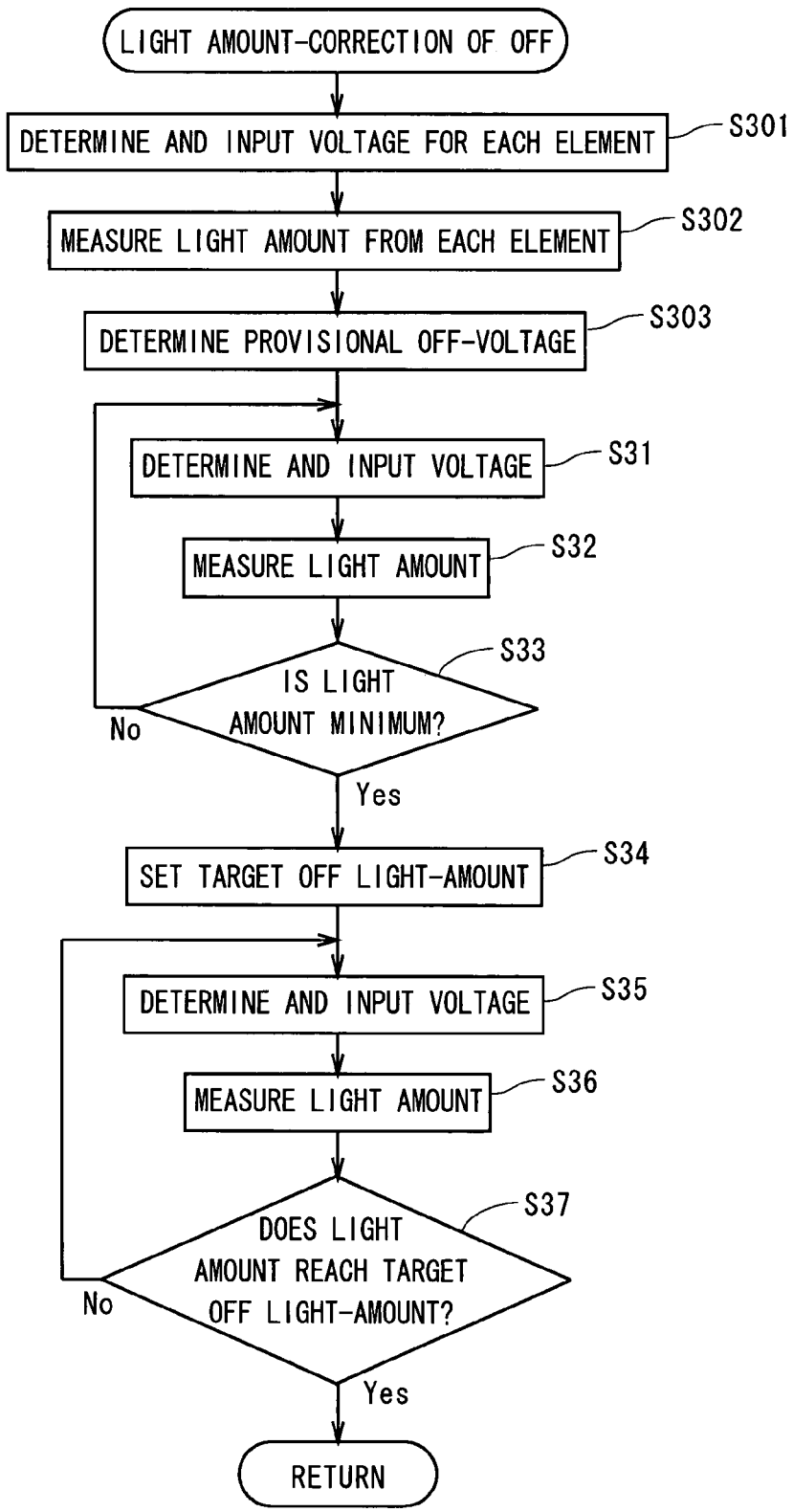
FIG. 20 is a flowchart showing an operation flow of OFF light-amount correction.

Next, discussion will be made on the OFF light-amount correction in FIG. 10 (Step S3). As discussed earlier, the OFF light-amount correction can be set optionally in advance in accordance with the photosensitive characteristics of the recording material 9 or the extinction ratio of the light modulator elements 121. For example, the OFF light-amount correction is performed in a case where unevenness appears in an image of vertical 1-dot-on and 1-dot-off lines (a plurality of lines extending in the main scan direction written by alternately fixing the light modulator elements 121 between the OFF state and the ON state) because of unevenness in the output light-amounts (the light amounts of the zeroth order light beams) leaking out from the light modulator elements 121 in the OFF state. FIG. 20 is a flowchart showing an operation flow of the OFF light-amount correction and Steps S31 to S33 and S35 to S37 are performed for each element.

In the light modulator element 121, the minimum light amount-voltage is higher than the maximum light amount-voltage (i.e., the absolute value of the minimum light amount-voltage is larger than that of the maximum light amount-voltage) as shown in FIG. 12. If the displacement amount of the moving ribbons 121a exceeds mechanical strength of the light modulator element 121, elastic breaking can occur in the light modulator element 121. Accordingly, it is necessary the voltage inputted to the light modulator element 121 is certainly restricted within a constant range in obtaining the accurate minimum light amount-voltage. However, like in the operation of obtaining the maximum light amount-voltage, if the method of measuring the light amount while repeatedly increasing the voltage by a small value is used in the operation of obtaining the minimum light amount-voltage, it takes long time for processing.

In the target voltage obtaining part 24 of the image recording apparatus 1, a provisional voltage to be applied in the OFF state is rapidly obtained and a target light-amount to be outputted in the OFF state (hereinafter, referred to as "target OFF light-amount") is set to obtain a final target voltage where the target OFF light-amount is outputted (hereinafter, referred to as "target OFF-voltage"). In a case where the voltage to be applied in the OFF state is not necessarily obtained with accuracy depending on the photosensitive characteristics of the recording material 9, the provisional voltage is used as the voltage for obtaining the target light amount. The provisional voltage to be applied in the OFF state is referred to as a "provisional OFF-voltage" in the following description.

The provisional OFF-voltage is obtained in a similar manner to the provisional ON-voltage described above. First, the plurality of light modulator elements 121 of the spatial light modulator 12 are divided into groups by a predetermined number where the light modulator elements 121 are continuously arranged, a plurality of voltages which gradually increase are inputted to (a plurality of) light modulator elements 121 in each group, respectively (Step S301). All light modulator elements 121 of the spatial light modulator 12 may be considered as one group. The lowest voltage and the electric potential difference between adjacent light modulator elements 121 are determined in advance so that the minimum light amount-voltage of each light modulator element 121 is surely included within a voltage range applied to the light modulator elements 121 belonging to one group.

Figure 21:
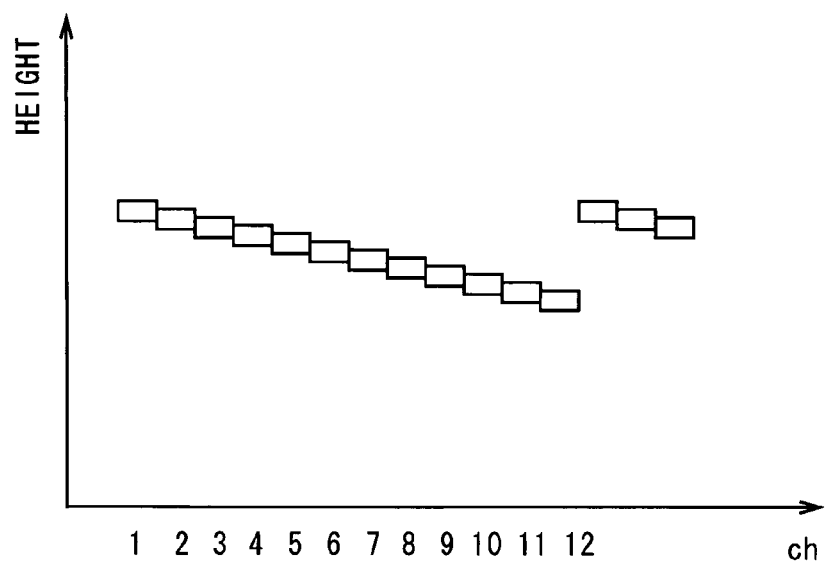
FIG. 21 is a view showing heights of moving ribbons in a case where voltages gradually increasing are applied to a plurality of light modulator elements in turn.

FIG. 21 is a view showing heights of the moving ribbons 121a from the base surface 121c, where twelve light modulator elements 121 are considered as one group and voltages which gradually increase are applied to the twelve light modulator elements 121 in turn. In FIG. 21, the height of the plurality of moving ribbons 121a in one light modulator element 121 is shown by one box. Since different voltages are applied to the light modulator elements 121 in one group, the height of the moving ribbons 121a decreases in accordance with increase of channel number according to the input voltage as shown in FIG. 21.

Figure 22:
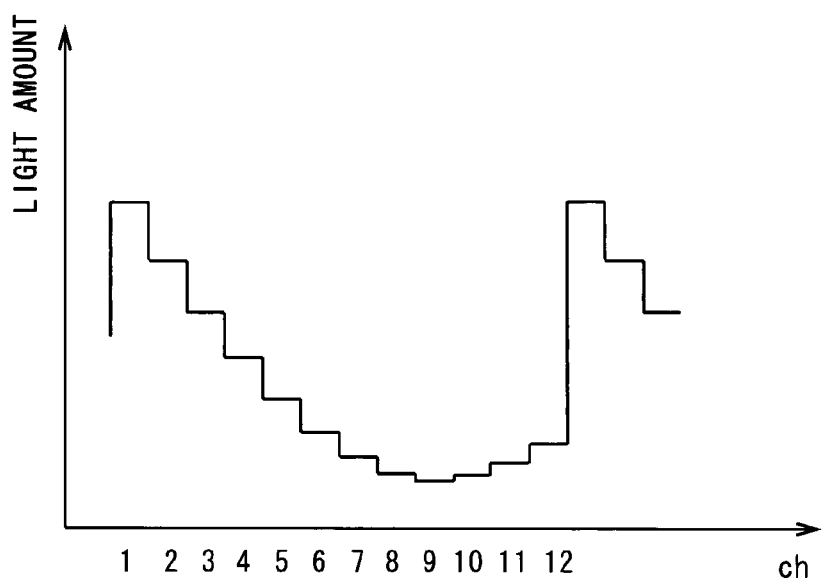
FIG. 22 is a view showing output light-amounts outputted from the plurality of light modulator elements shown in FIG. 21.

Next, the output light-amounts from the light modulator elements 121 in each group are measured (Step S302). FIG. 22 is a view showing measurement results of the output light-amounts from the plurality of light modulator elements 121 in the state shown in FIG. 21. In a case of the group shown in FIG. 22, since the light amount from the light modulator element 121 of 9ch is minimum, it is presumed that the voltage applied to 9ch is closer to the minimum light amount-voltage in each light modulator element 121 of the group. Then, the voltage applied to 9ch is determined as the provisional OFF-voltage which is common to the elements belonging in the above group. As described above, the provisional OFF-voltage is obtained as a voltage which is common to each group (Step S303).

As discussed above, the provisional OFF-voltage may be used as the voltage (final target OFF-voltage) which should be applied to the plurality of light modulator elements 121 in the OFF state belonging to the group, depending on a kind of the recording material 9. This makes it possible to rapidly determine the target OFF-voltage. In a case where the output light-amounts leaking out from the light modulator elements 121 in the OFF state largely affect the recording material 9, a process for making the output light-amounts leaking out from light modulator elements 121 in the OFF state to be constant is performed. This process is performed in accordance with the processes (Steps S21 to S27) of obtaining the target ON-voltages, except for obtaining the voltages in the OFF state.

First, looking at one light modulator element 121, the provisional OFF-voltage is inputted to the light modulator element 121 as the initial voltage (Step S31) and measurement of light amount is performed (Step S32). Next, the input voltage is slightly increased and the output light-amount from the light modulator element 121 is measured (Steps S31, S32) and it is confirmed whether or not the output light-amount decreases (Step S33). When the output light-amount increases, the input voltage is slightly decreased and light amount is measured (Steps S31, S32) and decrease of the output light-amount is confirmed (Step S33).

Subsequently, measurement of light amount and confirmation of light amount are repeated while slightly increasing or decreasing the input voltage so that the output light-amount decreases (Steps S31 to S33), and the input voltage when the light amount starts to increase is determined as the minimum light amount-voltage (Step S33). With the above operation, the minimum light-amount (hereinafter, referred to as "first minimum light-amount") when the light amount of the output light first becomes minimum from when the moving ribbons 121a start to sag in each light modulator element 121 and the minimum light amount-voltage which is inputted to each light modulator element 121 at the first minimum light-amount are obtained. In the actual process, after determination of the input voltages to all light modulator elements 121, measurement of light amounts on light modulator elements 121 is continuously performed to efficiently obtain the first minimum light-amounts and the minimum light amount-voltages for light modulator elements 121.

Other method of obtaining the first minimum light-amount and the minimum light amount-voltage may be used, for example, the first minimum light-amount and the minimum light amount-voltage may be obtained by repeating measurement of light amount while gradually increasing the input voltage from a certainly lower voltage than the minimum light amount-voltage.

When the first minimum light-amounts of all light modulator elements 121 are obtained, the maximum of the first minimum light-amounts is set as the target OFF light-amount (Step S34), and the operation goes to a process of obtaining the target OFF-voltages which are the voltages when the light amounts of light modulator elements 121 become the target OFF light-amount.

In acquisition of the target OFF-voltages, looking at one light modulator element 121, first, the minimum light amount-voltage is inputted to the light modulator element 121 as the initial voltage and measurement of light amount is performed (Steps S35, S36), the input voltage is slightly decreased and measurement of light amount is performed (Steps S35, S36), and then it is confirmed whether or not the output light-amount reaches the target OFF light-amount, i.e., the difference between the output light-amount and the target OFF light-amount is equal to or smaller than a predetermined value (Step S37). If the output light-amount does not reach the target OFF light-amount, measurement of light amount and confirmation of output light-amount are repeated while slightly decreasing the input voltage (Steps S35 to S37) and the input voltage when the output light-amount reaches the target OFF light-amount is determined as the target OFF-voltage (Step S37). The target OFF-voltage of each light modulator element 121 is stored in the target voltage obtaining part 24 as a part of the corrected data. In the actual process, after determination of the input voltages to all light modulator elements 121, measurement of light amounts on light modulator elements 121 is continuously performed to efficiently obtain the target OFF-voltages for light modulator elements 121.

With the above process using the provisional OFF-voltage, it is possible to rapidly obtain the target OFF-voltages where the output light-amounts leaking out from light modulator elements 121 in the OFF state are made constant accurately.

In the above-discussed operation, the first minimum light-amount is obtained for each light modulator element 121 from the provisional OFF-voltage by using the sequential search and the target OFF light-amount and the target OFF-voltage are obtained on the basis of the first minimum light-amount (or the provisional OFF-voltage is regarded as the target OFF-voltage), but the target OFF light-amount may be acquired in accordance with the method in FIG. 14 without using the first minimum light-amount of each light modulator element 121. Since the process of obtaining the provisional OFF-voltage is the same as Steps S301 to S303 in FIG. 20, the processes of obtaining the target OFF light-amounts and the target OFF-voltages will be described with reference to FIG. 20 in the following discussion.

In obtaining the provisional OFF-voltage, the plurality of light modulator elements 121 of the spatial light modulator 12 are divided into groups by a predetermined number where the light modulator elements 121 are continuously arranged, and a plurality of voltages which gradually increase are determined for (a plurality of) light modulator elements 121 in each group, and they are inputted to the light modulator elements 121 in each group, respectively (Step S301) as discussed above. All light modulator elements 121 of the spatial light modulator 12 may be considered as one group. The lowest voltage and the electric potential difference between adjacent light modulator elements 121 are determined in advance so that the (predicted) minimum light amount-voltage of each light modulator element 121 is surely included within a voltage range applied to the light modulator elements 121 belonging to one group. Next, the output light-amounts from the light modulator elements 121 in each group are measured (Step S302) and the voltage applied to the light modulator element 121 outputting the minimum light-amount is determined as the provisional OFF-voltage which is closer to the minimum light amount-voltage, being common to the group (Step S303).

When the provisional OFF-voltage is obtained for each group, the provisional OFF-voltage of each group is inputted to the light modulator elements 121 of the group (see Step S204 in FIG. 14) and measurement of light amount is performed again, instead of Steps S31 to S33 in FIG. 20. The maximum of the output light-amounts from all light modulator elements 121 is set as the target OFF light-amount (Step S34). The provisional OFF-voltage is normally different in each group, but the target OFF light-amount is obtained as a common value of all light modulator elements 121. The target OFF light-amount may be a predetermined light amount or less as long as it is equal to or larger than the maximum light-amount.

After that, the target OFF-voltages are obtained from the target OFF light-amount by the above-discussed method, however, the provisional OFF-voltage is used instead of the minimum light amount-voltage. That is to say, looking at one light modulator element 121, first, the provisional OFF-voltage of a group to which the light modulator element 121 belongs is inputted to the light modulator element 121 as the initial voltage (Step S35) and the light amount of the output light from the light modulator element 121 is acquired (Step S36). Subsequently, the input voltage is slightly decreased and measurement of light amount is performed (Steps S35, S36), it is confirmed whether or not the difference between the output light-amount and the target OFF light-amount is equal to or smaller than a predetermined value (Step S37), and then measurement of light amount and confirmation of output light-amount are repeated while slightly decreasing the input voltage, until the output light-amount reaches the target OFF light-amount (Steps S35 to S37).

There is a possibility the provisional OFF-voltage is higher than the minimum light amount-voltage depending on the light modulator element 121. In a case where the output light-amount decreases in accordance with reduction of the input voltage, reduction of the input voltage is performed until the output light-amount starts to increase without confirmation of the difference between the output light-amount and the target OFF light-amount. In another case where the output light-amount increases in accordance with reduction of the input voltage and the output light-amount is over the target OFF light-amount at the time of input of the initial voltage, measurement of light amount is performed while gradually increasing the input voltage until the output light-amount light reaches the target OFF light-amount.

When the output light-amount reaches the target OFF light-amount, the input voltage at this point is determined as the target OFF-voltage (Step S37). With the above operation, the target OFF-voltage becomes a voltage between the maximum light amount-voltage and the minimum light amount-voltage (the same as in the target ON-voltage which is discussed earlier). It is possible to rapidly obtain the target OFF light-amount and the target OFF-voltage by using the provisional OFF-voltage as discussed above.

The method of searching the first minimum light-amount and the minimum light amount-voltage of each light modulator element 121 with use of the provisional OFF-voltage shown in FIG. 20 can be applied to processes of searching the first maximum light-amount and the maximum light amount-voltage of each light modulator element.

As described earlier with reference to FIG. 11, first, "0" is applied to each light modulator element as the initial voltage in the above-discussed ON light-amount correction (Step S21) and a timing where the light amount from each light modulator element starts to decrease is searched while gradually increasing the voltage (Steps S21, S22, S23). The light amount when the light amount from each light modulator element starts to decrease is used as "the first maximum light-amount" for the light modulator element, and the voltage applied at the point of the above decrease is determined as "the maximum light amount-voltage" for the light modulator element.

The initial voltage applied to each light modulator element in Step S21 is not required to be "0". For example, slightly different voltages are applied to respective elements and light amounts of the respective elements are measured, an element outputting the maximum light-amount is specified from the light amounts outputted from the respective elements, and a voltage applied to the element is used as "the provisional ON-voltage". Then, "the provisional ON-voltage" may be applied as the initial voltage in Step S21 to search a timing where the light amount from each light modulator element starts to decrease while gradually increasing the voltage from the above initial voltage. With this operation, it is possible to rapidly search the first maximum light-amount and the maximum light amount-voltage of each light modulator element.

Figure 23:
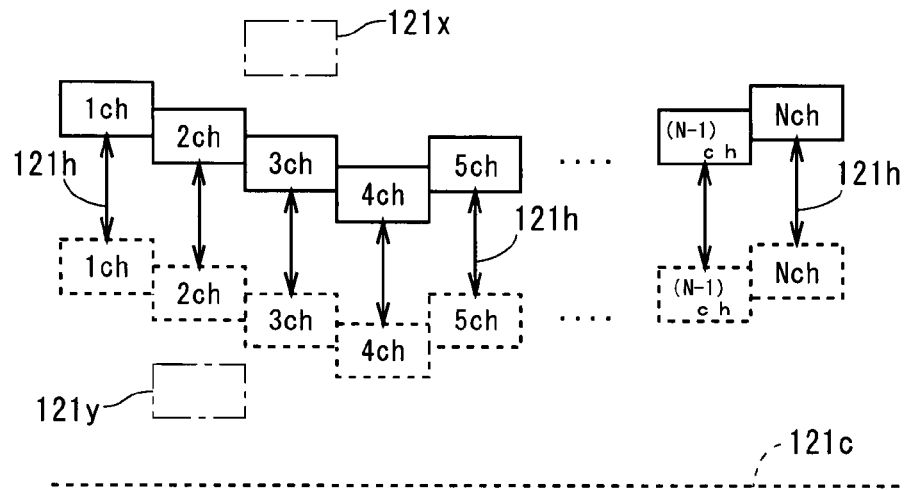
FIG. 23 is a view showing heights of moving ribbons after correcting.

FIG. 23 is a view showing a state of the light modulator elements 121 after performing the ON light-amount correction and the OFF light-amount correction. In FIG. 23, a box with a channel number represents a height of the moving ribbons 121*a* from the base surface 121*c*, solid-line boxes indicate heights of the moving ribbons 121*a* in the ON state, and broken-line boxes indicate heights of the moving ribbons 121*a* in the OFF state. As shown in FIG. 23, the output light-amount from each light modulator element 121 in the ON state is made to the target ON light-amount by adjusting the height of the moving ribbons 121*a* in the ON state. Also, the output light-amount (the zeroth order light beam) leaking out from each light modulator element 121 in the OFF state is made to the target OFF light-amount by adjusting the height of the moving ribbons 121*a* in the OFF state.

In each light modulator element 121, since the target ON-voltage is determined as the voltage between the maximum light amount-voltage and the minimum light amount-voltage, it is prevented the moving distance of the moving ribbons 121*a* is largely different between the light modulator elements 121 which change between the ON state and the OFF state, as indicated by the reference sign 121*h* (see FIG. 19). That is to say, if a voltage which does not exist between the maximum light amount-voltage and the minimum light amount-voltage is determined as the target ON-voltage in a light modulator element 121 like the voltage corresponding to the displacement amount Pt2 in FIG. 12, the height of a moving ribbon 121*a* of the light modulator element 121 in the ON state is largely different from the heights of other moving ribbons 121*a* of the above light modulator elements 121 as indicated by the block 121*x* in FIG. 23, and consequently, thicknesses of lines are not constant like the image of horizontal 1-dot-on and 1-dot-off lines in FIG. 19. However, such a problem does not happen in the image recording apparatus 1.

In the light modulator element 121, two voltages for the target OFF light-amount normally exist in the vicinity of the minimum light amount-voltage and the target voltage obtaining part 24 determines the target OFF-voltage only from voltages between the maximum light amount-voltage and the minimum light amount-voltage, therefore, it is prevented the moving distance of the moving ribbons 121*a* is largely different between the light modulator elements 121 in changing between the ON state and the OFF state. In FIG. 23, the block 121*y* illustrates the height of the moving ribbons 121*a* in a case where a voltage which does not exist between the maximum light amount-voltage and the minimum light amount-voltage is used as the target OFF-voltage.

After performing the ON light-amount correction and the OFF light-amount correction discussed above, through control of the general control part 21, the light modulator elements 121 are ON/OFF controlled while inputting the target ON-voltages to the light modulator elements 121 when the light modulator elements 121 are brought into the ON state. Concurrently with the ON/OFF control, the light from the light source 11 shown in FIG. 2 is applied to the special light modulator 12, the light from the special light modulator 12 is moved relatively to the recording material 9, and it is applied to the recording material 9, to achieve an appropriate image recording where unevenness is reduced. Further, since the target OFF-voltages are inputted to the light modulator elements 121 when the light modulator elements 121 are brought into the OFF state in the ON/OFF control, it is possible to perform an image recording more appropriately.

Figure 24:
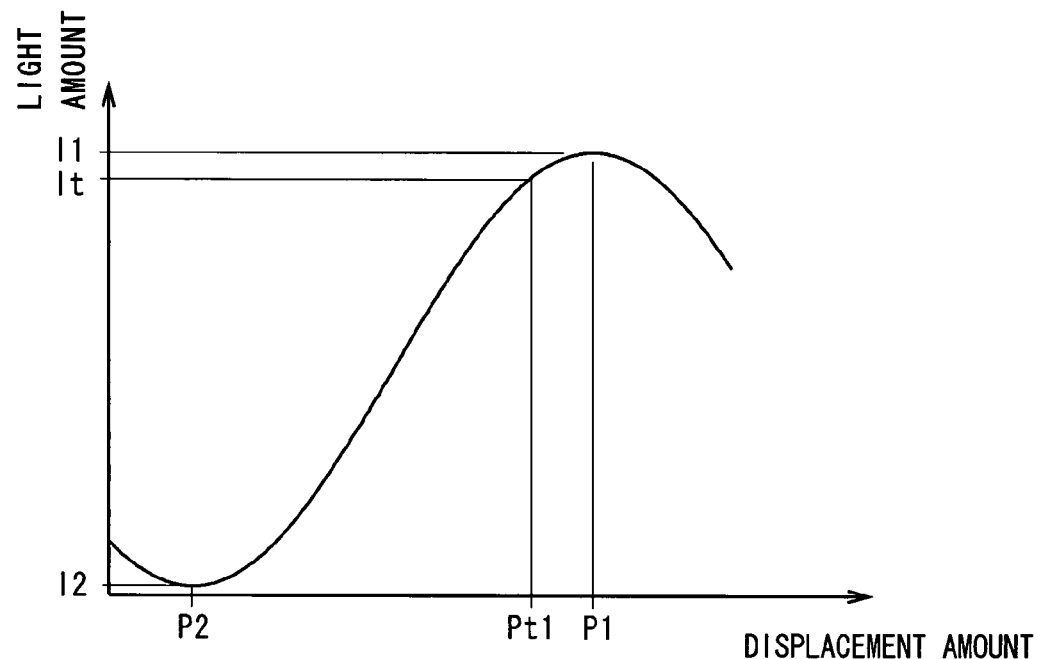
FIG. 24 is a graph showing a relationship between displacement amount of moving ribbons and output light-amount in accordance with another example.

FIG. 24 is a graph showing a relationship between displacement amount of moving ribbon 121a and output light-amount of a light modulator element 121 in accordance with other example. The construction of the light modulator element 121 in accordance with other example is the same as that in FIGS. 3 to 5C excepting that the difference of the initial height between moving reflective surfaces 122a and fixed reflective surfaces 122b is different. As shown in FIG. 24, the maximum light amount-voltage is higher than the minimum light amount-voltage (i.e., the absolute value of the maximum light amount-voltage is larger than that of the minimum light amount-voltage), the light amount becomes a minimum light-amount I2 at the displacement amount P2 where the moving ribbons 121a are slightly sagged, and then the light amount increases as the moving ribbons 121a are more sagged to become a maximum light-amount I1 at the displacement amount P1.

In the case of such a light modulator element 121, since the maximum light amount-voltage at the maximum light-amount I1 (i.e., the first maximum light-amount) which is acquired when the light amount of the output light first becomes maximum from when the moving ribbons 121a start to sag in the light modulator element 121 is largely apart from 0, the ON light-amount correction is rapidly performed by the method in accordance with the OFF light-amount correction shown in FIG. 20. In other words, a plurality of voltages gradually increasing in a voltage range which is assumed to include the maximum light amount-voltages of either light modulator elements 121 belonging to each group are applied to the light modulator elements 121 in each group, respectively (see Step S301) and output light-amounts from respective light modulator elements 121 are measured (see Step S302). The voltage applied to the light modulator element 121 where the output light-amount is maximum is determined as the provisional ON-voltage which is common to the light modulator elements in the group (see Step S303).

Subsequently, in each light modulator element 121, the maximum light amount-voltage is searched by repeating measurement of light amount while slightly and gradually increasing or decreasing the input voltage in the vicinity of the provisional ON-voltage (see Steps S31 to S33). The minimum of the maximum light-amounts is determined as the target ON light-amount It (see Step S34) and measurement of light amount is repeated while gradually decreasing the input voltage with using the maximum light amount-voltage as the initial voltage (see Steps S35 to S37), to determine the input voltage when the output light-amount reaches the target ON light-amount (the input voltage at the displacement amount Pt1 in FIG. 24) as the target ON-voltage (see Step S37).

When the OFF light-amount correction is performed in the light modulator element 121 having the properties shown in FIG. 24, the processing is performed in accordance with the ON light-amount correction shown in FIG. 11. That is, in each light modulator element 121, the minimum light amount-voltage is searched by repeating measurement of light amount while slightly increasing the input voltage with using 0 as the initial voltage (see Steps S21 to S23) and the maximum of the first minimum light-amounts is determined as the target OFF light-amount (see Step S24). Measurement of light amount is repeated while gradually increasing the input voltage with using the minimum light amount-voltage as the initial voltage (see Steps S25 to S27) and the input voltage when the output light-amount reaches the target OFF light-amount is determined as the target OFF-voltage (see Step S27).

With the above ON light-amount correction and OFF light-amount correction, it is possible to suppress the difference in the moving distance of the moving ribbons 121a among the light modulator elements 121 in changing between the ON state and the OFF state and achieve an appropriate image recording.

In the ON light-amount correction which is performed on the light modulator element 121 having the difference in height between the moving reflective surfaces 122a and the fixed reflective surfaces 122b in the initial state, generally, the target ON-voltage inputted to the light modulator element 121 when the output light-amount from the light modulator element 121 is made to the target ON light-amount is obtained from the voltage range between the maximum light amount-voltage inputted to the light modulator element 121 when the output light-amount first becomes maximum from when the moving ribbons 121a start to sag and the minimum light amount-voltage inputted to the light modulator element 121 when the output light-amount first becomes minimum, as described with reference to FIGS. 12 and 24. As a result, it is possible to obtain the appropriate target ON-voltage which is capable of preventing the moving distance of the moving ribbons 121a from being largely different among the light modulator elements 121 in changing between the ON state and the OFF state and achieve an appropriate image recording where the light amounts in the ON state are uniform and unevenness caused by change in thickness of the image of horizontal 1-dot-on and 1-dot-off lines does not appear.

In the OFF light-amount correction, the target OFF-voltage inputted to the light modulator element 121 when the output light-amount from the light modulator element 121 is made to the target OFF light-amount is obtained from the voltage range between the maximum light amount-voltage inputted to the light modulator element 121 when the output light-amount first becomes maximum from when the moving ribbons 121a start to sag and the minimum light amount-voltage inputted to the light modulator element 121 when the output light-amount first becomes minimum. As a result, it is possible to obtain the appropriate target OFF-voltage which is capable of more suppressing the difference in the moving distance of the moving ribbons 121a among the light modulator elements 121 in changing between the ON state and the OFF state and achieve a more appropriate image recording.

The binary search which is explained in obtaining the target ON-voltage in the light modulator element 121 shown in FIG. 12 may be applied to acquisition of the target OFF-voltage in the light modulator element 121 shown in FIG. 24. In other words, it is preferable the binary search is used for obtaining a voltage of a smaller value (smaller absolute value) out of the target ON-voltage and the target OFF-voltage (hereinafter, the voltage is referred to as "target low-voltage").

The process of the binary search will be generally described with using the expression of the target low-voltage. At first, a second voltage which is an average of a first voltage which is surely over the target low-voltage and a smaller one out of the maximum light amount-voltage and the minimum light amount-voltage is inputted to each light modulator element 121 (Step S25) and an output light-amount from each light modulator element 121 is measured (Step S26). It is confirmed whether or not the difference between the output light-amount and the target light-amount falls within an allowable range (Step S27). When the difference is out of the allowable range, a half of the difference between the first voltage and the second voltage is added or subtracted to/from the second voltage so that the output light-amount gets closer to the target light-amount, to obtain an updated second voltage. Further, the second voltage which has a value before updating is updated to a first voltage, the updated second voltage is inputted to the light modulator element 121 and measurement of light amount is repeated (Steps S25, S26), and it is confirmed whether the output light-amount reaches the target light-amount (Step S27).

Update of the first voltage and the second voltage, input of the second voltage, and confirmation of the output light-amount are repeated (Steps S25 to S27) and the second voltage is determined as the target low-voltage when the difference between the output light-amount and the target light-amount falls within the allowable range (Step S27). It is possible to rapidly obtain the target low-voltage with the above process.

Next, a process of obtaining the provisional OFF-voltage in the group of the light modulator elements having the properties shown in FIG. 12 or the provisional ON-voltage (hereinafter, referred to as "provisional high-voltage") in the group of the light modulator elements having the properties shown in FIG. 24 will be generally discussed in accordance with FIG. 20. The plurality of light modulator elements 121 are divided into at least one group and a plurality of voltages gradually increasing in a voltage range which is considered to surely include a voltage of a larger value out of the maximum light amount-voltage and the minimum light amount-voltage of the light modulator elements 121 belonging to each group, are inputted to a plurality of light modulator elements 121 in the group, respectively (Step S301) and a plurality of output light-amounts from the light modulator elements 121 in each group are measured (Step S302). A voltage which corresponds to the minimum or the maximum of the plurality of output light-amounts and is not any of the minimum and the maximum out of the plurality of input voltages (i.e., the voltage which does not correspond to borders of the voltage range) is rapidly determined as the provisional high-voltage of the light modulator elements 121 in each group (Step S303).

The minimum light amount-voltage or the maximum light amount-voltage of each light modulator element 121 belonging to each group is rapidly obtained by repeating measurement of output light-amount while gradually increasing or decreasing an input voltage from the provisional high-voltage of each group (Steps S31 to S33), and a target high-voltage of a larger value out of the target ON-voltage and the target OFF-voltage is rapidly obtained by repeating measurement of output light-amount while gradually decreasing or increasing the input voltage from the provisional high-voltage (Steps S34 to S37).

As discussed above, the maximum light amount-voltage of the light modulator elements 121 having the properties shown in FIG. 12 may be acquired from the provisional ON-voltage in the group of the light modulator elements 121, and further, the minimum light amount-voltage of the light modulator elements 121 having the properties shown in FIG. 24 may be acquired from the provisional OFF-voltage in the group of the light modulator elements 121. When a process of obtaining the provisional ON-voltage or the provisional OFF-voltage (hereinafter, referred to as "provisional low-voltage") is generally discussed in accordance with FIG. 20, first, the plurality of light modulator elements 121 are divided into at least one group and a plurality of voltages gradually increasing in a voltage range which is considered to surely include a voltage of a smaller value out of the maximum light amount-voltage and the minimum light amount-voltage of the light modulator elements 121 belonging to each group, are inputted to a plurality of light modulator elements 121 in the group, respectively (Step S301) and a plurality of output light-amounts from the light modulator elements 121 in each group are measured (Step S302). And then, a voltage which corresponds to the maximum or the minimum of the plurality of output light-amounts and is not any of the maximum and the minimum out of the plurality of input voltages (i.e., the voltage which does not correspond to borders of the voltage range) is rapidly determined as the provisional low-voltage of the light modulator elements 121 in each group (Step S303).

In respective light modulator elements in each group, the maximum light amount-voltage or the minimum light amount-voltage is rapidly obtained by repeating measurement of output light-amount while gradually increasing or decreasing an input voltage from the provisional low-voltage (Steps S31 to S33), and a target low-voltage of a smaller value out of the target ON-voltage and the target OFF-voltage is rapidly obtained by repeating measurement of output light-amount while gradually increasing or decreasing the input voltage from the provisional low-voltage (Steps S34 to S37).

In the above description, for example, when the two voltages Pt1 and Pt2 corresponding to the target ON light-amount exist as shown in FIG. 12, since the voltage Pt1 between the maximum light amount-voltage P1 and the minimum light amount-voltage P2 is used as the target ON-voltage, it is possible to prevent variations in thicknesses of lines in writing of the image of horizontal 1-dot-on and 1-dot-off lines illustrated in FIG. 19. If Pt2 absolutely exists (that is to say, a light amount in the voltage 0 is sufficiently small), it is possible to suppress variations in heights of the moving ribbons 121$a$ in the ON state among the light modulator elements 121 and prevent variations in thicknesses of lines in the image of horizontal 1-dot-on and 1-dot-off lines, even if Pt2 is used as the target ON-voltage.

Similarly, the target OFF-voltage is not necessarily obtained as the voltage between the maximum light amount-voltage and the minimum light amount-voltage, but may be obtained as the voltage which is gradually increased from the minimum light amount-voltage to first reach the target OFF light-amount in the light modulator element 121 having the properties shown in FIG. 12. Also in the light modulator element 121 having the properties shown in FIG. 24, voltages other than those between the maximum light amount-voltage and the minimum light amount-voltage can be used as the target ON-voltage and the target OFF-voltage.

In other words, the target ON-voltage is obtained as the voltage which is equal to the input voltage when the output light-amount from each light modulator element 121 first reaches the target ON light-amount when the input voltage is gradually increased or decreased from the maximum light amount-voltage of each light modulator element 121 (any one of increasing and decreasing is only applied to all light modulator elements 121). The target OFF-voltage is obtained as the voltage which is equal to the input voltage when the output light-amount from each light modulator element 121 first reaches the target OFF light-amount when the input voltage is gradually increased or decreased from the minimum light amount-voltage of each light modulator element 121 (any one of increasing and decreasing is only applied to all light modulator elements 121). As a result, it is possible to obtain the appropriate target ON-voltage and target OFF-voltage.

Naturally, it is not necessary the input voltage is actually gradually increased or decreased from the maximum light amount-voltage or the minimum light amount-voltage when the target ON-voltage and the target OFF-voltage are obtained as discussed above. It is enough that the obtained target ON-voltage and target OFF-voltage are consequently equal to a voltage obtained by gradually increasing or decreasing the voltage from the maximum light amount-voltage or the minimum light amount-voltage.

In other words, the target voltage which is the target ON-voltage or the target OFF-voltage is obtained as a voltage which is equal to an input voltage when an output light-amount of each light modulator element 121 first reaches the target light-amount in gradually increasing or decreasing the input voltage from the maximum light amount-voltage or the minimum light amount-voltage which is the input voltage corresponding to a light amount which is closer to the target light-amount, being the target ON light-amount or the target OFF light-amount, out of the first minimum light-amount when a light amount of an output light first becomes minimum from when the moving ribbons 121a start to sag in each light modulator element 121 and the first maximum light-amount when a light amount of an output light first becomes maximum from when the moving ribbons 121a start to sag in each light modulator element 121.

Figure 25:
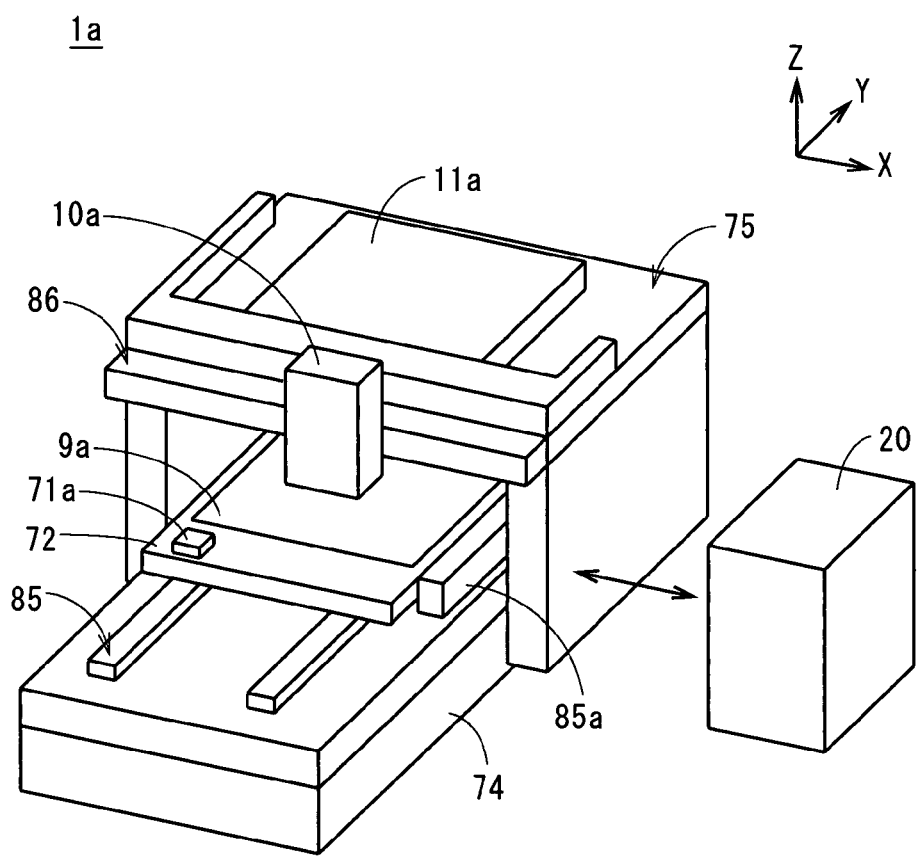
FIG. 25 is a view showing an image recording apparatus in accordance with the second preferred embodiment.
Figure 26:
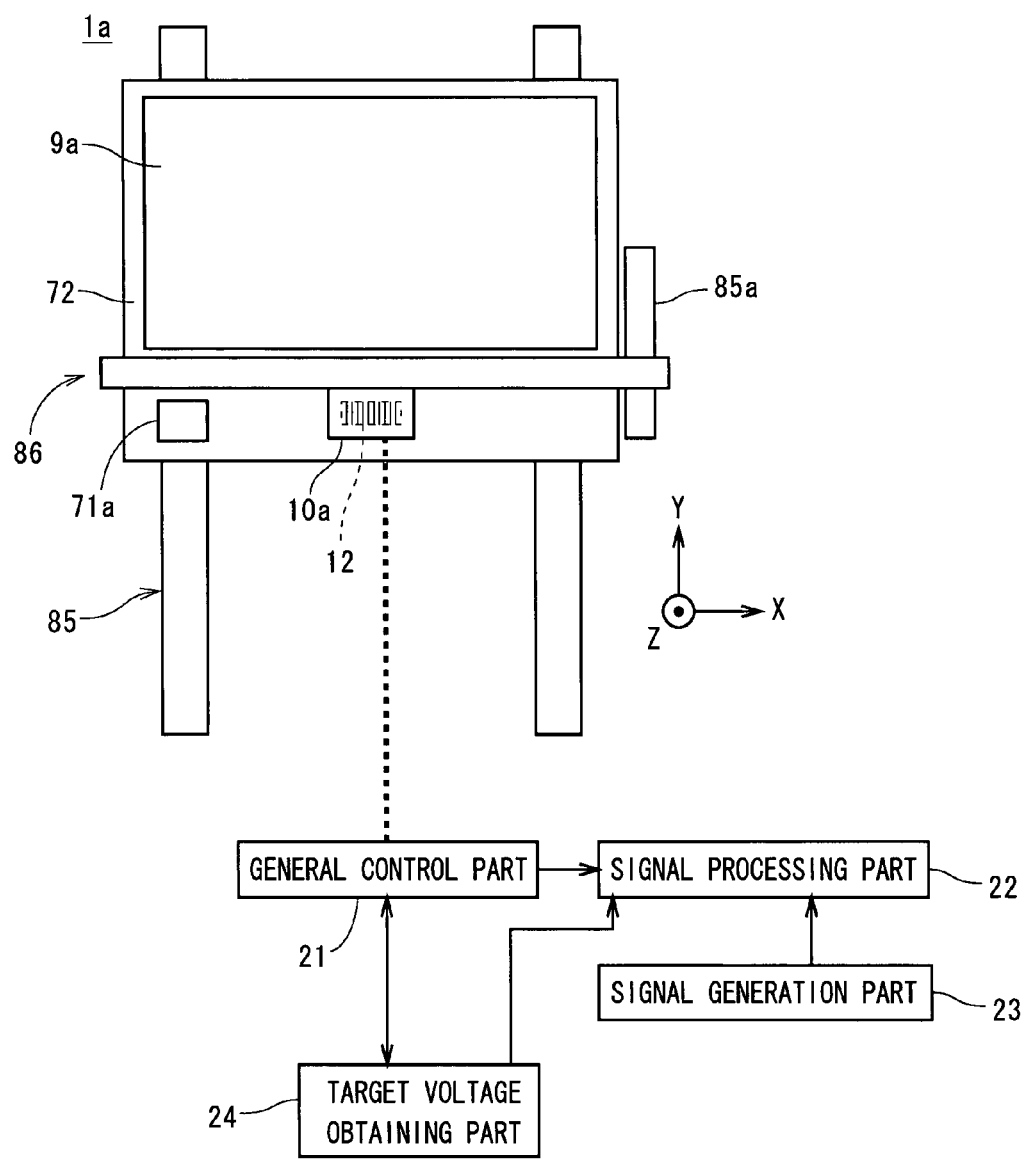
FIG. 26 is a view showing main constituent elements of the image recording apparatus.

FIG. 25 is a perspective view showing an appearance of an image recording apparatus 1a in accordance with the second preferred embodiment of the present invention and FIG. 26 is a view showing mechanical principal parts and a functional constitution of the image recording apparatus 1a. The general control part 21, the signal processing part 22, the signal generation part 23, and the target voltage obtaining part 24 in FIG. 26 are the same as those in the first preferred embodiment, and they are provided in a control unit 20 of FIG. 25.

The image recording apparatus 1a is an apparatus for recording an image of a pattern such as mask or wire on a glass substrate 9a for manufacturing a glass mask, a TFT (Thin Film Transistor) liquid crystal panel or the like, and it is a so-called direct drawing apparatus for directly drawing an image by exposure. In the image recording apparatus 1a, the glass substrate 9a coated with a photosensitive material is a recording material in a broad sense, which is a physical material for recording information of an image. The image recording apparatus 1a comprises a table 72 for holding the glass substrate 9a on its surface on the (+Z) side and a table moving mechanism 85, on the other side of the table 72, for moving the table 72 in the Y direction (main scan direction) is fixed on a base part 74. A position detecting module 85a for detecting position of the table 72 is provided on the base part 74.

An optical head 10a for emitting light to the glass substrate 9a is located above the table 72 and the optical head 10a is supported by a head moving mechanism 86, being movable in the X direction which is the sub scan direction. That is to say, the main scan direction and the sub scan direction are parallel to the table 72, and the table moving mechanism 85 and the head moving mechanism 86 function as a mechanism for moving the table 72 relatively to the optical head 10a including the spatial light modulator 12 (see FIG. 2) at a constant speed in the main scan direction and also moving the table 72 relatively to the optical head 10a in the sub scan direction perpendicular to the main scan direction.

As shown in FIG. 25, a frame 75 is attached to the base part 74 over the table 72 and the head moving mechanism 86 is fixed on the frame 75. In the image recording apparatus 1a, a light source 11a is positioned on the frame 75 and light from the light source 11a is directed in the optical head 10a through optical fibers which are not shown. A film of photosensitive material (i.e., resist) to be photosensed by irradiation with ultraviolet rays is previously formed on the main surface on the (+Z) side of the glass substrate 9a in this preferred embodiment. The constituent elements of the optical head 10a are the same as those of the optical head 10 in FIG. 2 except that the light source 11a is positioned outside. As shown in FIG. 26, though the arrangement direction of the plurality of light modulator elements 121 (see FIG. 3) of the spatial light modulator 12 provided in the optical head 10a corresponds to the sub scan direction which is the X direction, the arrangement direction of the plurality of light modulator elements 121 do not necessarily have to correspond to the sub scan direction only if the arrangement direction is a direction crossing the main scan direction which is the Y direction of the optical head 10a. In other words, the main scan direction which is the moving direction of the glass substrate 9a has only to be a direction crossing the arrangement direction of positions irradiated with light, similarly to the first preferred embodiment.

As shown in FIGS. 25 and 26, a light amount measurement part 71a on the table 72 is provided in a position which is on the corner on the (−Y) side and (−X) side of the table 72 and the position doesn't overlap with the glass substrate 9a. The light amount measurement part 71a has the same construction as the light amount measurement part 71 in FIG. 7 except for receiving light emitted from the optical head 10a in the (−Z) direction. The width (width in the direction corresponding to the arrangement direction of the light modulator elements 121) of the clearance formed in the slit 712 (see FIG. 7) of the light amount measurement part 71a is made half of a width in the sub scan direction of a spot image of one light modulator element 121 as in the first preferred embodiment. Since resolution of the light amount measurement part 71a increases inverse proportionally to the width of the clearance, the width of the clearance may be less than half of the width in the sub scan direction of a spot image of one light modulator element 121.

An operation for recording an image onto the photosensitive material on the glass substrate 9a in the image recording apparatus 1a is the same as in FIG. 10 except that a transfer path of irradiation positions of light on the glass substrate 9a differs in that of the image recording apparatus 1 of FIG. 1.

In the image recording, first, measurement of light amount is performed to confirm the necessity of modification of the corrected data (Steps S11, S12) and writing is performed when it is determined modification is not necessary (Step S13). In measurement of light amount, the optical head 10a moves up to a position opposed to the light amount measurement part 71a by driving the table moving mechanism 85 and the head moving mechanism 86, and light amounts of an output light outputted from respective light modulator elements 121 are sequentially measured through the slit 712 similarly to the first preferred embodiment, while the optical head 10a is moved in the sub scan direction at a low speed by the head moving mechanism 86. In other words, the head moving mechanism 86 functions as a slit moving mechanism for moving the slit 712 relatively to the light modulator elements 121.

The ON light-amount correction (Step S2) is performed when it is determined modification of the corrected data is necessary through measurement of light amounts, the OFF light-amount correction is performed as necessary (Step S3), and then the operation goes to the image recording. Processes of the ON light-amount correction and the OFF light-amount correction are the same as those in the first preferred embodiment.

In writing on the glass substrate 9a (i.e., recording by exposure) (Step S13), first, the table 72 is moved relatively to the optical head 10a including the spatial light modulator 12 in the (−Y) direction by the table moving mechanism 85 and irradiation positions of light from the optical head 10a are thereby continuously moved relatively to the glass substrate 9a in the (+Y) direction (i.e., main scanning is performed). In parallel with movement of the table 72, writing is performed in synchronization with a signal outputted from the position detecting module 85a and in this time, lights at corrected ON light-amounts (and corrected OFF light-amounts) are outputted by the general control part 21 and the signal processing part 22 on the basis of the corrected data calculated in the target voltage obtaining part 24. With this operation, it is possible to perform an appropriate writing on a strip-like region (swath) which extends in the Y direction with a width corresponding to the size of image of spots of the spatial light modulator 12.

When the irradiation positions reach an end of the glass substrate 9a on the (+Y) side, the optical head 10a moves in the sub scan direction (X direction) by a distance corresponding to a width of the strip-like region in the X direction, the moving direction of the table 72 is reversed, and then writing in a backward path of the table 72 is performed on a new strip-like region in contact with the side of the strip-like region written in a forward path. Then, the optical head 10a intermittently moves in the X direction while reciprocally moving the table 72 in the Y direction, to record an image on the whole of the plane glass substrate 9a in the image recording apparatus 1a.

As discussed above, when light is applied to the glass substrate 9a for manufacturing a glass mask, a TFT liquid crystal panel or the like in the image recording apparatus 1a, since the output light-amount from each light modulator element 121 in the ON state (and the OFF state) is made uniform, therefore, it is possible to increase quality of a recorded image.

Though the preferred embodiments of the present invention have been discussed above, the present invention is not limited to the above-discussed preferred embodiments, but allows various variations.

If the moving ribbons 121a and the fixed ribbons 121b can be regarded as strip-like reflection surfaces, these surfaces do not have to be in a ribbon shape in a strict meaning. The fixed ribbons 121b may be changed in various manners only if they are fixed reflective portions having fixed reflective surfaces on their upper surfaces. For example, the fixed ribbons 121b may be provided as block-like portions.

Though each edge 124a of the first areas 123a which are projections of the moving reflective surfaces 122a onto the base surface 121c overlaps with the edge 124b of the second areas 123b which are projections of the fixed reflective surfaces 122b onto the base surface 121c in FIG. 5A, each edge 124a may be located inside the second areas 123b.

As the methods of obtaining the lower one out of the maximum light amount-voltage and the minimum light amount-voltage and the lower one out of the target ON-voltage and the target OFF-voltage, a method of presuming them from change of a light amount relative to a voltage may be used. For example, in a case where movement of the moving ribbons 121a can be predicted, it is possible to rapidly determine the maximum light amount-voltage, the minimum light amount-voltage, the target ON-voltage, or the target OFF-voltage by measuring variations in light amounts in a predetermined voltage range.

Although the zeroth order light beams are the output lights, i.e., signal lights for recording, and the light amounts of the zeroth order light beams are corrected in the above preferred embodiments, there may be a case where the first order diffracted light beams are used as the output lights and the light amounts of the first order diffracted light beams are corrected. In this case, the first maximum light-amount in the above preferred embodiment is a light amount when the light amount of the first order diffracted light beams first becomes maximum from when the moving ribbons 121a start to sag in the light modulator element 121, and a voltage inputted to the light modulator element 121 at this point is the maximum light amount-voltage. The first minimum light-amount is a light amount when the light amount of the first order diffracted light beams first becomes minimum from when the moving ribbons 121a start to sag, and a voltage inputted to the light modulator element 121 at this point is used as the minimum light amount-voltage. It is possible to more improve the extinction ratio by using the first order diffracted light beams as the output light.

Confirmation of correction of light amounts is not necessarily surely performed before recording of an image depending on the performance of the spatial light modulator 12. Confirmation of modification is performed in a case where there is a possibility the sate of the image recording apparatus 1 changes, such as cases where a predetermined time period passes after modification or confirmation of corrected data is previously performed or a predetermined number of image recordings are performed after modification of corrected data, and it may be determined that confirmation of modification of corrected data is not necessary if it is assumed the state of the image recording apparatus 1 does not change.

The target ON light-amount may be set to a smaller value than the minimum value of the first maximum light-amounts of the plurality of light modulator elements 121 as long as it is equal to or smaller than the minimum of the first maximum light-amounts. However, the target ON light-amount should be set so as to be equal to or larger than a predetermined light amount which functions as the target ON light-amount. Similarly, there may be a case where the target OFF light-amount is set to a larger value than the maximum value of the first minimum light-amounts of the plurality of light modulator elements 121 as long as it is equal to or lager than the maximum of the first minimum light-amounts and is equal to or smaller than a predetermined light amount which functions as the target OFF light-amount.

The processes of rapidly determining the target ON light-amount and the target OFF light-amount from the provisional ON-voltage and the provisional OFF-voltage without actually obtaining the first maximum light-amount and the first minimum light-amount, can be applied to the light modulator element 121 having the properties shown in FIG. 24, and the provisional ON-voltage or the provisional OFF-voltage obtained for one group may be inputted to all light modulator elements 121 to obtain the target ON light-amount or the target OFF light-amount. Further, a voltage determined by measurement in advance or a voltage obtained by theoretical calculation may be inputted to all light modulator elements 121 instead of the provisional ON-voltage and the provisional OFF-voltage, to determine the target ON light-amounts and the target OFF light-amounts. As described above, various methods can be used for setting the light amount of the output light which is the zeroth order light beam or the first order diffracted light beams outputted from each light modulator element 121 in the ON or OFF states, as the target light-amount which is common to the plurality of light modulator elements 121.

Measurement of light amount performed by the light amount measurement part 71 is not limited to a slit type but may be performed in a state where, for example, the light modulator elements 121 are brought into the ON state one by one. Output light-amounts of a plurality of light modulator elements 121 which are away from one another may be measured with use of a plurality of light receiving elements at the same time.

Though the light modulator element in the above preferred embodiments has six moving ribbons 121a (or moving reflective surfaces 122a) which are controlled simultaneously, each moving ribbon 121a may be controlled independently as is disclosed in Japan Patent Application Laid-Open No. 2007-121881 and disclosure of which is herein incorporated by reference. In this case, the spatial light modulator is controlled so that spatially continuous three or more pairs of moving ribbon 121a and fixed ribbons 121b (or fixed reflective surface 122b) are made ON state or OFF state, and a position and a size of each light modulator element can be changed. A pair of a moving ribbon 121a and a fixed ribbon 121b may be regarded as one light modulator element.

The light source 11 is not limited to a semiconductor laser but may be a gas laser, a solid laser, a LED (Light Emitting Diode), a discharge lamp, or the like.

The general control part 21, the signal processing part 22, the signal generation part 23, and the target voltage obtaining part 24 shown in FIG. 1 are not necessarily provided in isolation physically and their functions can be achieved by one or more constituent elements including a circuit for computations.

The recording material 9 and the glass substrate 9a can be traveled by other methods only if they are movable relatively to the optical heads 10 and 10a. The recording material carrying image information may be material coated with photosensitive material such as a printed circuit board or a semiconductor substrate, other material with photosensitivity, or material which responds to heat by light irradiation.

While the invention has been shown and described in detail, the foregoing description is in all aspects illustrative and not restrictive. It is therefore understood that numerous modifications and variations can be devised without departing from the scope of the invention.

This application claims priority benefit under 35 U.S.C. Section 119 of Japanese Patent Application No. 2006-242334 filed in the Japan Patent Office on Sep. 7, 2006 and Japanese Patent Application No. 2007-090831 filed in the Japan Patent Office on Mar. 30, 2007, the entire disclosures of which are incorporated herein by reference.

What is claimed is:

1. A method of correcting output light-amounts of a spatial light modulator with diffraction grating structure comprising a plurality of light modulator elements, wherein
    each light modulator element of said plurality of light modulator elements comprises fixed reflective portions having strip-like fixed reflective surfaces parallel to a base surface and moving ribbons having strip-like moving reflective surfaces parallel to said base surface, and said fixed reflective portions and said moving ribbons are alternately arranged in a predetermined direction in said each light modulator element,
    said moving ribbons are sagged in accordance with a voltage inputted to said each light modulator element, to change a height of said moving reflective surfaces from said base surface, said each light modulator element changes between a state of emitting a zeroth order light beam and a state of first order diffracted light beams, and a height of said moving reflective surfaces from said base surface is different from that of said fixed reflective surfaces from said base surface in a state where said moving ribbons are not sagged in said each light modulator element, and
    said method of correcting output light-amounts of a spatial light modulator comprises the steps of:
    a) setting a light amount of an output light, which is a zeroth order light beam or first order diffracted light beams outputted from said each light modulator element in an ON state or an OFF state, as a target light-amount which is common to said plurality of light modulator elements; and
    b) obtaining a target voltage which is equal to an input voltage to said each light modulator element when an output light-amount of said each light modulator element first reaches said target light-amount in gradually increasing or decreasing said input voltage from a voltage corresponding to a light amount which is closer to said target light-amount out of the first minimum light-amount when a light amount of an output light first becomes minimum from when said moving ribbons start to sag in increasing said input voltage and the first maximum light-amount when a light amount of an output light first becomes maximum from when said moving ribbons start to sag in increasing said input voltage.

2. The method according to claim 1, wherein
said target voltage of said each light modulator element is a voltage between a maximum light amount-voltage which is inputted to said each light modulator element at said first maximum light-amount and a minimum light amount-voltage which is inputted to said each light modulator element at said first minimum light-amount.

3. The method according to claim 1, wherein
said step a) comprises the steps of:
a1) obtaining said first maximum light-amount of said each light modulator element and a maximum light amount-voltage which is inputted to said each light modulator element at said first maximum light-amount; and
a2) setting said target light-amount which is a light amount being equal to or smaller than a minimum out of a plurality of first maximum light-amounts of said plurality of light modulator elements and being equal to or larger than a predetermined light amount.

4. The method according to claim 3, wherein
said step a) further comprises, before said step a1), the steps of:
a3) dividing said plurality of light modulator elements into at least one group to input a plurality of voltages to light modulator elements in each group, respectively, said plurality of voltages gradually increasing in a voltage range which surely includes maximum light amount-voltages of said light modulator elements belonging to said each group;
a4) measuring a plurality of output light-amounts of said light modulator elements in said each group; and
a5) determining a voltage corresponding to a maximum out of said plurality of output light-amounts as a provisional voltage of said light modulator elements in said each group, wherein
said maximum light amount-voltage of each light modulator element belonging to said each group is obtained by repeating measurement of an output light-amount while gradually increasing or decreasing an input voltage from said provisional voltage of said each group in said step a1).

5. The method according to claim 1, wherein
said step a) comprises the steps of:
a1) obtaining said first minimum light-amount of said each light modulator element and a minimum light amount-voltage which is inputted to said each light modulator element at said first minimum light-amount; and
a2) setting said target light-amount which is a light amount being equal to or larger than a maximum out of a plurality of first minimum light-amounts of said plurality of light modulator elements and being equal to or smaller than a predetermined light amount.

6. The method according to claim 5, wherein
said step a) further comprises, before said step a1), the steps of:
a3) dividing said plurality of light modulator elements into at least one group to input a plurality of voltages to light modulator elements in each group, respectively, said plurality of voltages gradually increasing in a voltage range which surely includes minimum light amount-voltages of said light modulator elements belonging to said each group;
a4) measuring a plurality of output light-amounts of said light modulator elements in said each group; and
a5) determining a voltage corresponding to a minimum out of said plurality of output light-amounts as a provisional voltage of said light modulator elements in said each group, wherein
said minimum light amount-voltage of each light modulator element belonging to said each group is obtained by repeating measurement of an output light-amount while gradually increasing or decreasing an input voltage from said provisional voltage of said each group in said step a1).

7. The method according to claim 1, wherein
said target light-amount is a light amount in an ON state, and
said step a) comprises the steps of:
a1) dividing said plurality of light modulator elements into at least one group to input a plurality of voltages to light modulator elements in each group, respectively, said plurality of voltages gradually increasing in a voltage range which surely includes voltages to be inputted at first maximum light-amounts of said light modulator elements belonging to said each group;
a2) measuring a plurality of output light-amounts of said light modulator elements in said each group;
a3) determining a voltage corresponding to a maximum out of said plurality of output light-amounts as a provisional voltage of said light modulator elements in said each group;
a4) inputting said provisional voltage to said light modulator elements in said each group; and
a5) setting said target light-amount which is a light amount being equal to or smaller than a minimum out of output light-amounts of said plurality of light modulator elements and being equal to or larger than a predetermined light amount.

8. The method according to claim 2, wherein
said target light-amount is a light amount in an ON state, and
said step a) comprises the steps of:
a1) dividing said plurality of light modulator elements into at least one group to input a plurality of voltages to light modulator elements in each group, respectively, said plurality of voltages gradually increasing in a voltage range which surely includes voltages to be inputted at first maximum light-amounts of said light modulator elements belonging to said each group;
a2) measuring a plurality of output light-amounts of said light modulator elements in said each group;
a3) determining a voltage corresponding to a maximum out of said plurality of output light-amounts as a provisional voltage of said light modulator elements in said each group;
a4) inputting said provisional voltage to said light modulator elements in said each group; and
a5) setting said target light-amount which is a light amount being equal to or smaller than a minimum out of output light-amounts of said plurality of light modulator elements and being equal to or larger than a predetermined light amount.

9. The method according to claim 1, wherein
said target light-amount is a light amount in an OFF state, and
said step a) comprises the steps of:
a1) dividing said plurality of light modulator elements into at least one group to input a plurality of voltages to light modulator elements in each group, respectively, said plurality of voltages gradually increasing in a voltage range which surely includes voltages to be inputted at first minimum light-amounts of said light modulator elements belonging to said each group;
a2) measuring a plurality of output light-amounts of said light modulator elements in said each group;
a3) determining a voltage corresponding to a minimum out of said plurality of output light-amounts as a provisional voltage of said light modulator elements in said each group;
a4) inputting said provisional voltage to said light modulator elements in said each group; and
a5) setting said target light-amount which is a light amount being equal to or larger than a maximum out of output light-amounts of said plurality of light modulator elements and being equal to or smaller than a predetermined light amount.

10. The method according to claim 2, wherein
said target light-amount is a light amount in an OFF state, and
said step a) comprises the steps of:
a1) dividing said plurality of light modulator elements into at least one group to input a plurality of voltages to light modulator elements in each group, respectively, said plurality of voltages gradually increasing in a voltage range which surely includes voltages to be inputted at first minimum light-amounts of said light modulator elements belonging to said each group;
a2) measuring a plurality of output light-amounts of said light modulator elements in said each group;
a3) determining a voltage corresponding to a minimum out of said plurality of output light-amounts as a provisional voltage of said light modulator elements in said each group;
a4) inputting said provisional voltage to said light modulator elements in said each group; and
a5) setting said target light-amount which is a light amount being equal to or larger than a maximum out of output light-amounts of said plurality of light modulator elements and being equal to or smaller than a predetermined light amount.

11. The method according to claim 1, wherein
said target light-amount is a target ON light-amount which is set as an output light-amount of said each light modulator element in an ON state,
a target ON-voltage, which is said target voltage inputted to said each light modulator element when an output light-amount of said each light modulator element is made to said target ON light-amount, is obtained in said step b), and
said method of correcting output light-amounts further comprises the steps of:
c) setting a light amount of an output light outputted from said each light modulator element in an OFF state as a target OFF light-amount which is common to said plurality of light modulator elements; and d) obtaining a target OFF-voltage which is equal to an input voltage to said each light modulator element when an output light-amount of said each light modulator element first reaches said target OFF light-amount in gradually increasing or decreasing an input voltage from a voltage corresponding to a light amount closer to said target OFF light-amount out of said first minimum light-amount and said first maximum light-amount.

12. The method according to claim 11, wherein
said target OFF-voltage of said each light modulator element is a voltage between a maximum light amount-voltage which is inputted to said each light modulator element at said first maximum light-amount and a minimum light amount-voltage which is inputted to said each light modulator element at said first minimum light-amount.

13. The method according to claim 2, wherein
said target voltage corresponds to a smaller one of voltages which are inputted to said each light modulator element in an ON state and said each light modulator element in an OFF state, and
said step b) comprises the steps of:
b1) inputting a second voltage to said each light modulator element, said second voltage being an average of a first voltage which is surely over said target voltage and a smaller one of a maximum light amount-voltage inputted to said each light modulator element at said first maximum light-amount and a minimum light amount-voltage inputted to said each light modulator element at said first minimum light-amount;
b2) measuring an output light-amount of said each light modulator element;
b3) confirming whether or not a difference between said output light-amount and said target light-amount falls within an allowable range;
b4) acquiring an updated second voltage which is obtained by adding or subtracting a half of a difference between said first voltage and said second voltage to/from said second voltage so that an output light-amount gets closer to said target light-amount, when said difference in said step b3) being out of said allowable range, and subsequently updating said second voltage, which has a value before updating, to a first voltage;
b5) inputting said updated second voltage to said each light modulator element and going back to said step b2); and
b6) determining said second voltage as said target voltage when said difference falls within said allowable range in said step b3).

14. The method according to claim 1, wherein
said target light-amount is a target ON light-amount which is set as an output light-amount of said each light modulator element in an ON state,
a target ON-voltage, which is said target voltage inputted to said each light modulator element when an output light-amount of said each light modulator element is made to said target ON light-amount, is obtained in said step b), and
said method of correcting output light-amounts further comprises the steps of:
e1) dividing said plurality of light modulator elements into at least one group to input a plurality of voltages to light modulator elements in each group, respectively, said plurality of voltages gradually increasing in a voltage range which surely includes voltages to be inputted at first minimum light-amounts of said light modulator elements belonging to said each group;
e2) measuring a plurality of output light-amounts of said light modulator elements in said each group; and
e3) determining a voltage corresponding to a minimum out of said plurality of output light-amounts as a target OFF-voltage to be inputted to said light modulator elements in said each group in an OFF state.

15. The method according to claim 1, wherein
each edge, extending in a direction perpendicular to said predetermined direction, of first areas which are projections of said moving reflective surfaces onto said base surface is overlapped with an edge of second areas which are projections of said fixed reflective surfaces onto said base surface or said each edge of said first areas is located inside said second areas.

16. An image recording method of recording an image on a recording material irradiated with light from a spatial light modulator while moving said light relatively to said recording material, wherein
said spatial light modulator is a diffraction grating type one comprising a plurality of light modulator elements, each light modulator element of said plurality of light modulator elements comprises fixed reflective portions having strip-like fixed reflective surfaces parallel to a base surface and moving ribbons having strip-like moving reflective surfaces parallel to said base surface, and said fixed reflective portions and said moving ribbons are alternately arranged in a predetermined direction in said each light modulator element,
said moving ribbons are sagged in accordance with a voltage inputted to said each light modulator element, to change a height of said moving reflective surfaces from said base surface, said each light modulator element changes between a state of emitting a zeroth order light beam and a state of first order diffracted light beams, and a height of said moving reflective surfaces from said base surface is different from that of said fixed reflective surfaces from said base surface in a state where said moving ribbons are not sagged in said each light modulator element, and
said image recording method comprises the steps of:
a) setting a light amount of an output light, which is a zeroth order light beam or first order diffracted light beams outputted from said each light modulator element in an ON state, as a target ON light-amount which is common to said plurality of light modulator elements;
b) obtaining a target ON-voltage which is equal to an input voltage to said each light modulator element when an output light-amount of said each light modulator element first reaches said target ON light-amount in gradually increasing or decreasing said input voltage from a voltage corresponding to the first maximum light-amount when a light amount of an output light first becomes maximum from when said moving ribbons start to sag in increasing said input voltage; and
c) performing ON/OFF control of said each light modulator element while said target ON-voltage is inputted to said each light modulator element brought into an ON state and applying light to said spatial light modulator concurrently with said ON/OFF control, to apply light emitted from said spatial light modulator onto a recording material while moving said light relatively to said recording material.

17. The image recording method according to claim 16, further comprising the step of
measuring an output light-amount of said each light modulator element before recording an image on each recording material, to confirm necessity of said step b).

18. An apparatus for correcting output light-amounts of a spatial light modulator with diffraction grating structure comprising a plurality of light modulator elements, wherein each light modulator element of said plurality of light modulator elements comprises fixed reflective portions having strip-like fixed reflective surfaces parallel to a base surface and moving ribbons having strip-like moving reflective surfaces parallel to said base surface, and said fixed reflective portions and said moving ribbons are alternately arranged in a predetermined direction in said each light modulator element, said moving ribbons are sagged in accordance with a voltage inputted to said each light modulator element, to change a height of said moving reflective surfaces from said base surface, said each light modulator element changes between a state of emitting a zeroth order light beam and a state of first order diffracted light beams, and a height of said moving reflective surfaces from said base surface is different from that of said fixed reflective surfaces from said base surface in a state where said moving ribbons are not sagged in said each light modulator element, said apparatus for correcting output light-amounts of a spatial light modulator comprises:

a light source for applying light to a spatial light modulator;

a control part for inputting a voltage to said each light modulator element;

a light amount measurement part for measuring a light amount of an output light which is a zeroth order light beam or first order diffracted light beams outputted from said each light modulator element; and a target voltage obtaining part for obtaining a target voltage which is inputted to said each light modulator element when a light amount of an output light from said each light modulator element is made to a target light-amount, and said control part, said light amount measurement part, and said target voltage obtaining part execute the steps of:

a) setting a light amount of an output light outputted from said each light modulator element in an ON state or an OFF state, as a target light-amount which is common to said plurality of light modulator elements; and b) obtaining a target voltage which is equal to an input voltage to said each light modulator element when an output light-amount of said each light modulator element first reaches said target light-amount in gradually increasing or decreasing said input voltage from a voltage corresponding to a light amount which is closer to said target light-amount out of the first minimum light-amount when a light amount of an output light first becomes minimum from when said moving ribbons start to sag in increasing said input voltage and the first maximum light-amount when a light amount of an output light first becomes maximum from when said moving ribbons start to sag in increasing said input voltage.

19. The apparatus according to claim 18, wherein each edge, extending in a direction perpendicular to said predetermined direction, of first areas which are projections of said moving reflective surfaces onto said base surface is overlapped with an edge of second areas which are projections of said fixed reflective surfaces onto said base surface or said each edge of said first areas is located inside said second areas.

20. An image recording apparatus for recording an image on a recording material irradiated with light from a spatial light modulator while moving said light relatively to said recording material, comprising:

a spatial light modulator;

a light source for applying light to said spatial light modulator;

a correction device for correcting output light-amounts outputted from said spatial light modulator;

a signal processing part for generating an image signal inputted to said spatial light modulator; and a scanning mechanism for applying light emitted from said spatial light modulator onto a recording material while moving said light relatively to said recording material, wherein said spatial light modulator is a diffraction grating type one comprising a plurality of light modulator elements, each light modulator element of said plurality of light modulator elements comprises fixed reflective portions having strip-like fixed reflective surfaces parallel to a base surface and moving ribbons having strip-like moving reflective surfaces parallel to said base surface, and said fixed reflective portions and said moving ribbons are alternately arranged in a predetermined direction in said each light modulator element, said moving ribbons are sagged in accordance with a voltage inputted to said each light modulator element, to change a height of said moving reflective surfaces from said base surface, said each light modulator element changes between a state of emitting a zeroth order light beam and a state of first order diffracted light beams, and a height of said moving reflective surfaces from said base surface is different from that of said fixed reflective surfaces from said base surface in a state where said moving ribbons are not sagged in said each light modulator element, said correction device comprises:

a control part for inputting a voltage to said each light modulator element;

a light amount measurement part for measuring a light amount of an output light which is a zeroth order light beam or first order diffracted light beams outputted from said each light modulator element; and a target voltage obtaining part for obtaining a target voltage which is inputted to said each light modulator element when a light amount of an output light from said each light modulator element is made to a target light-amount, and said control part, said light amount measurement part, and said target voltage obtaining part execute the steps of:

a) setting a light amount of an output light outputted from said each light modulator element in an ON state or an OFF state, as a target light-amount which is common to said plurality of light modulator elements; and b) obtaining a target voltage which is equal to an input voltage to said each light modulator element when an output light-amount of said each light modulator element first reaches said target light-amount in gradually increasing or decreasing said input voltage from a voltage corresponding to a light amount which is closer to said target light-amount out of the first minimum light-amount when a light amount of an output light first becomes minimum from when said moving ribbons start to sag in increasing said input voltage and the first maximum light-amount when a light amount of an output light first becomes maximum from when said moving ribbons start to sag in increasing said input voltage.

* * * * *